(12) United States Patent
Harada et al.

(10) Patent No.: US 7,956,413 B2
(45) Date of Patent: Jun. 7, 2011

(54) SEMICONDUCTOR DEVICE HAVING A FIELD EFFECT TRANSISTOR USING A HIGH DIELECTRIC CONSTANT GATE INSULATING FILM AND MANUFACTURING METHOD OF THE SAME

(75) Inventors: Yoshinao Harada, Hyogo (JP); Shigenori Hayashi, Nara (JP); Masaaki Niwa, Osaka (JP)

(73) Assignee: Panasonic Corporation, Osaka (JP)

( * ) Notice: Subject to any disclaimer, the term of this patent is extended or adjusted under 35 U.S.C. 154(b) by 64 days.

(21) Appl. No.: 12/478,252

(22) Filed: Jun. 4, 2009

(65) Prior Publication Data
US 2009/0242983 A1 Oct. 1, 2009

Related U.S. Application Data

(62) Division of application No. 11/254,727, filed on Oct. 21, 2005, now Pat. No. 7,554,156.

(30) Foreign Application Priority Data

Dec. 15, 2004 (JP) ................................. 2004-362971

(51) Int. Cl.
*H01L 29/94* (2006.01)
(52) U.S. Cl. .. 257/344; 257/408; 257/410; 257/E21.433
(58) Field of Classification Search ................... 257/344, 257/408, 410, 405, E21.433; 438/287
See application file for complete search history.

(56) References Cited

U.S. PATENT DOCUMENTS 6,027,976 A * 2/2000 Gardner et al. ............... 438/287
6,746,926 B1 * 6/2004 Yu ................................. 438/291
6,913,980 B2 * 7/2005 Wu et al. ..................... 438/301
7,029,967 B2 * 4/2006 Zhao et al. ................... 438/199
7,157,779 B2 * 1/2007 Nishibe et al. ............... 257/408
2003/0042548 A1 * 3/2003 Maeda et al. ................ 257/369
(Continued)

FOREIGN PATENT DOCUMENTS
JP 2003-069011 A 3/2003
(Continued)

OTHER PUBLICATIONS

English translation of Japanese Notice of Reasons for Rejection issued in Japanese Patent Application No. JP 2004-362971 dated Dec. 15, 2009.
(Continued)

*Primary Examiner* — Michael Trinh
(74) *Attorney, Agent, or Firm* — McDermott Will & Emery LLP

(57) ABSTRACT

In a method for manufacturing a semiconductor device having an N-channel field effect transistor, the N-channel field effect transistor is formed by a process including the steps of forming a high dielectric constant gate insulating film on a substrate, forming a gate electrode on the high dielectric constant gate insulating film, forming an extension region by introducing N-type impurities into the substrate by using at least the gate electrode as a mask, and forming a pocket region by introducing P-type impurities under the extension region in the substrate by using at least the gate electrode as a mask. An amount of arsenic (As) that is introduced as the N-type impurities is in a range that is equal to or lower than a prescribed value that is determined based on a thickness of the high dielectric constant gate insulating film.

10 Claims, 12 Drawing Sheets

U.S. PATENT DOCUMENTS

| | | |
|---|---|---|
| 2003/0067045 A1 | 4/2003 | Sugiyama et al. |
| 2003/0178685 A1 | 9/2003 | Saiki |
| 2004/0018690 A1 | 1/2004 | Muraoka |
| 2004/0169222 A1 | 9/2004 | Horiguchi |
| 2006/0121740 A1 | 6/2006 | Sakai et al. |

FOREIGN PATENT DOCUMENTS

| | | |
|---|---|---|
| JP | 2003-179227 | 6/2003 |
| JP | 2003-273241 | 9/2003 |
| JP | 2003-297826 | 10/2003 |
| JP | 2004-266019 | 9/2004 |
| JP | 2004-304053 | 10/2004 |
| WO | WO 2004/017418 A1 | 2/2004 |

OTHER PUBLICATIONS

A. Kaneko, et al., "Flatband Voltage Shift Caused by Dopants Diffused from Poly-Si Gate Electrode in Poly-Si /HfSiO/SiO$_2$/Si", Extended Abstracts of the 2003 International Conference on Solid State Devices and Materials, Tokyo, 2003, pp. 56-57.

* cited by examiner

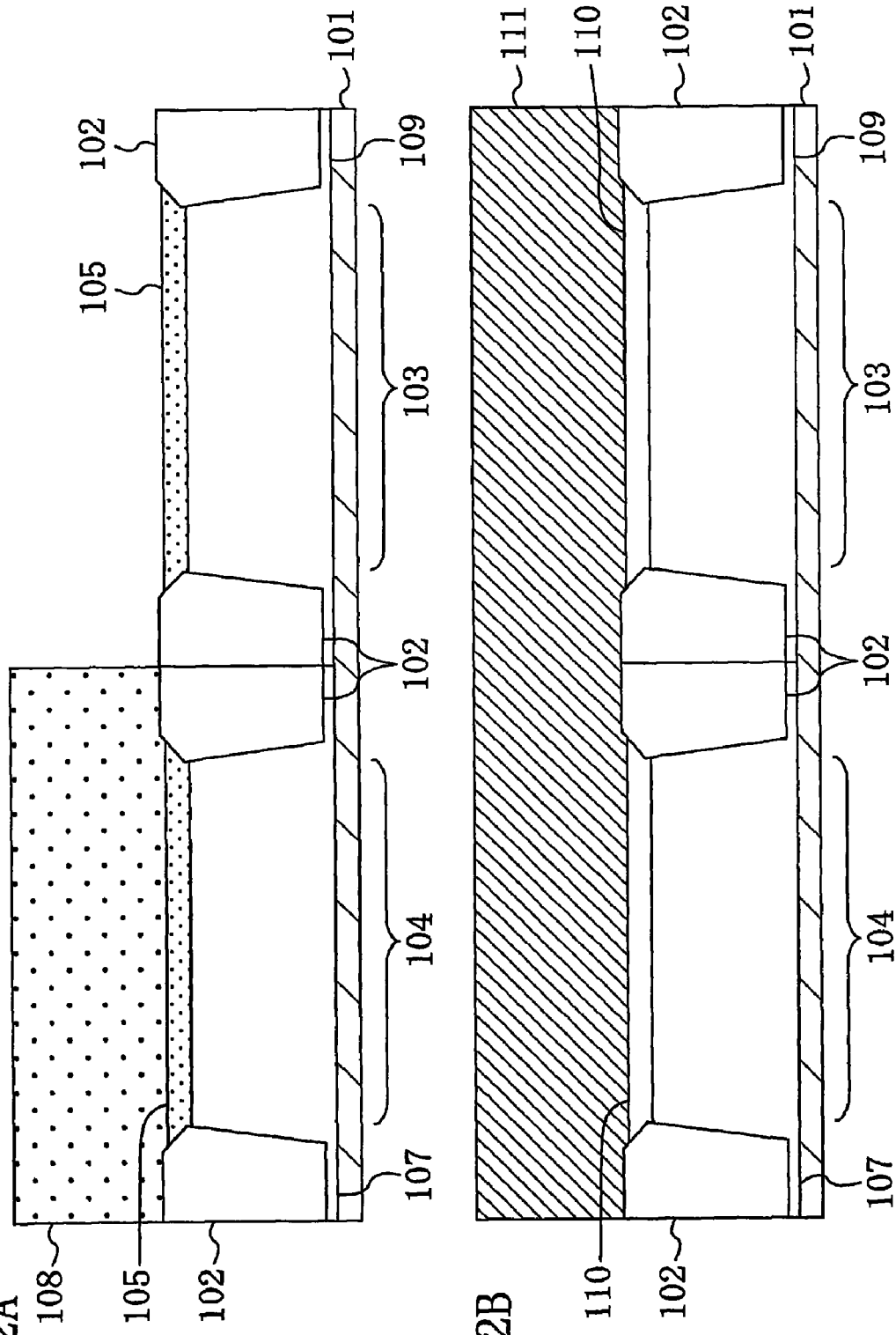

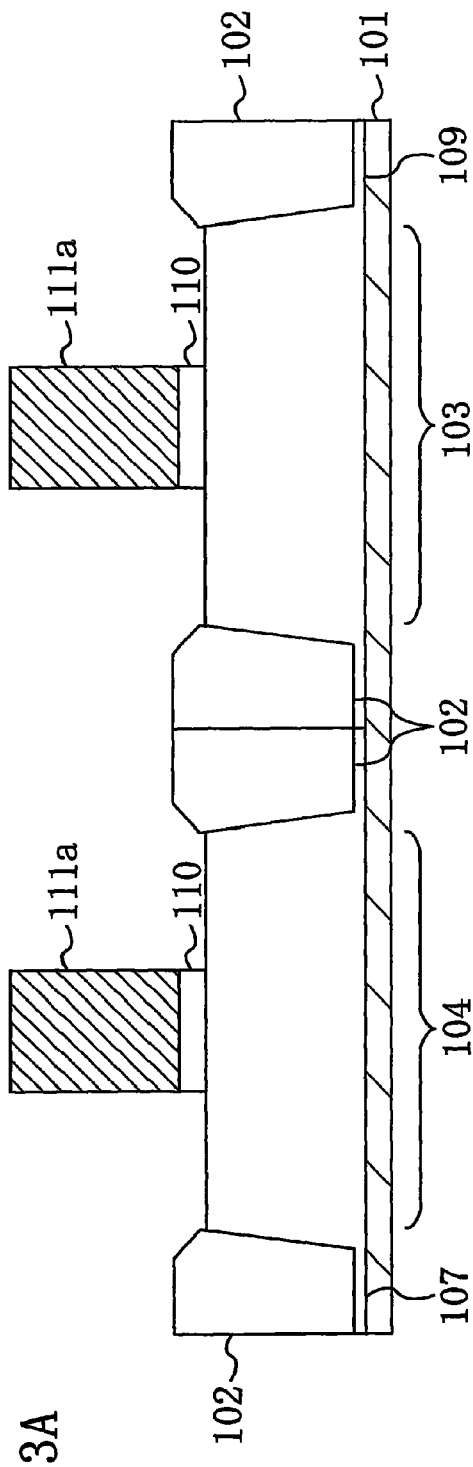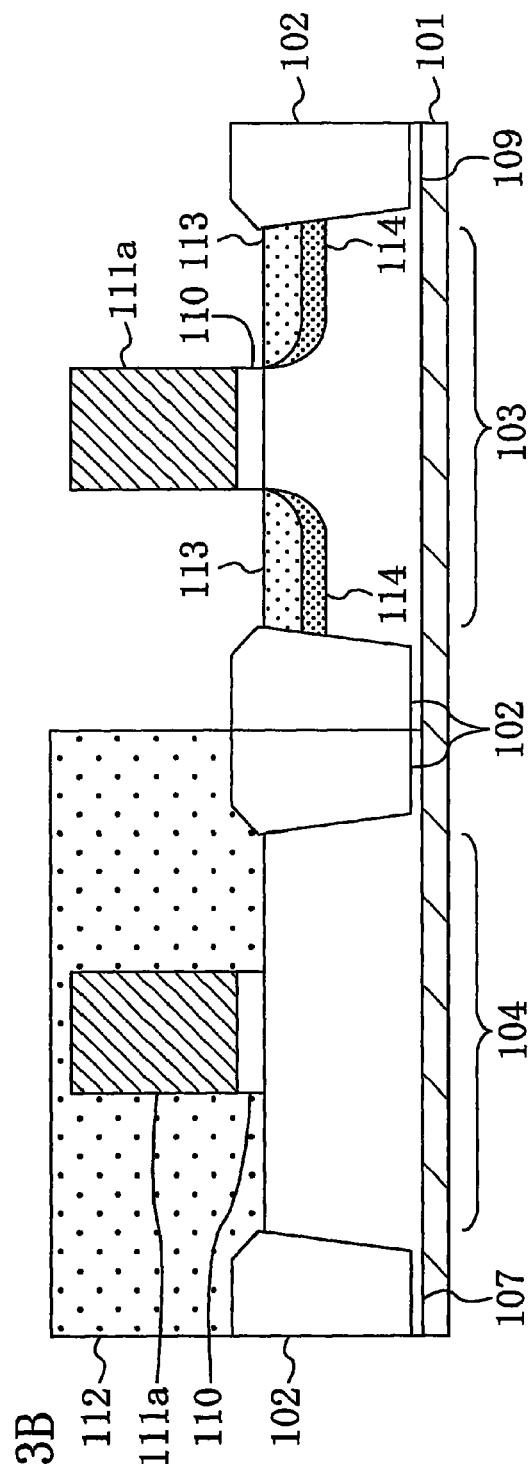

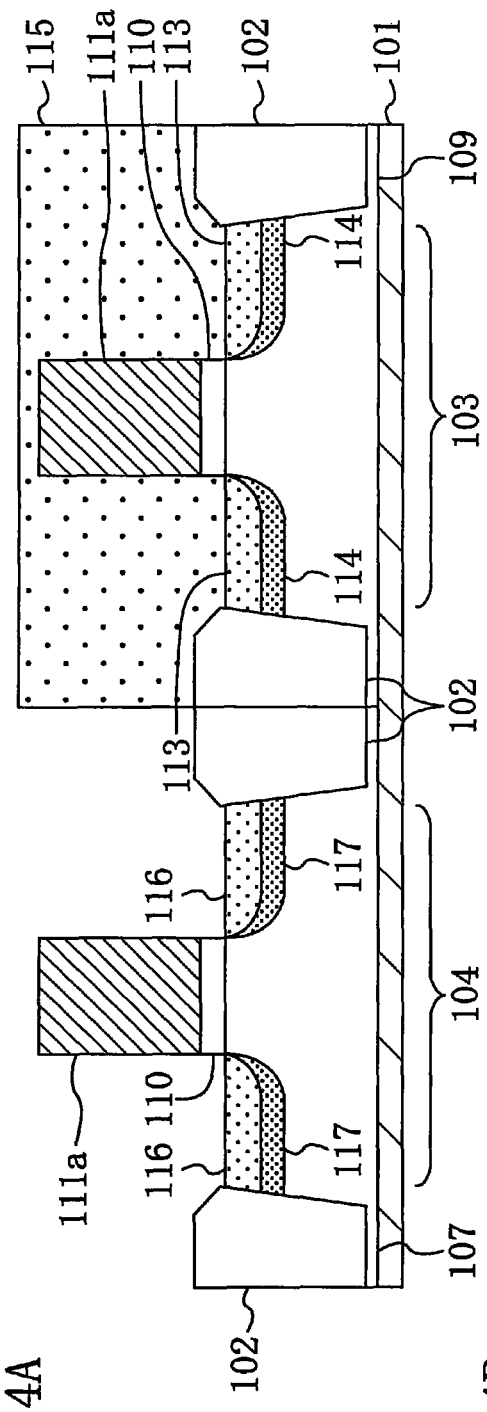
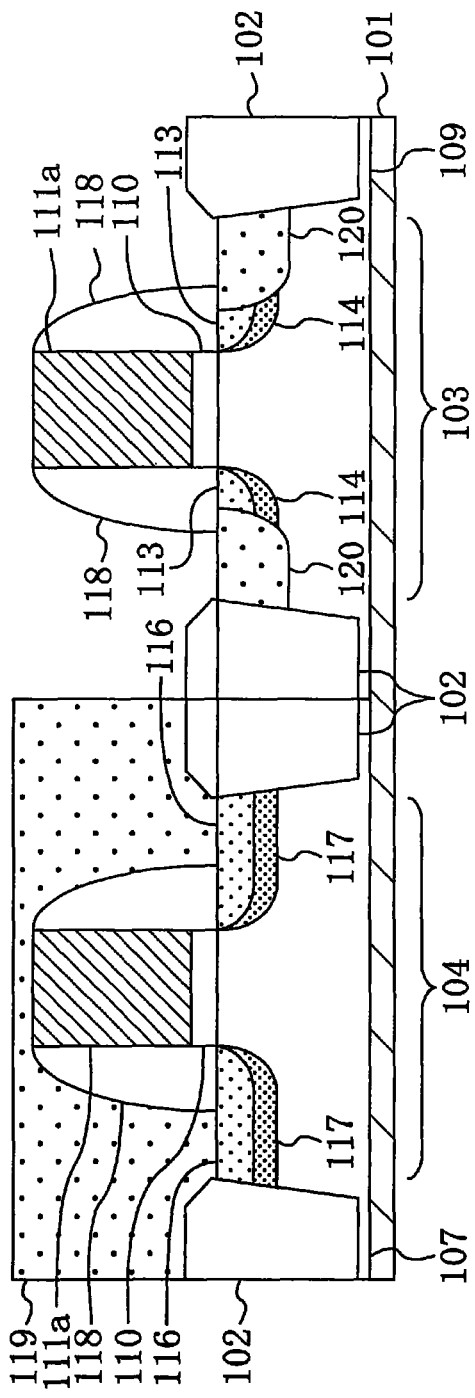
FIG. 4A
FIG. 4B

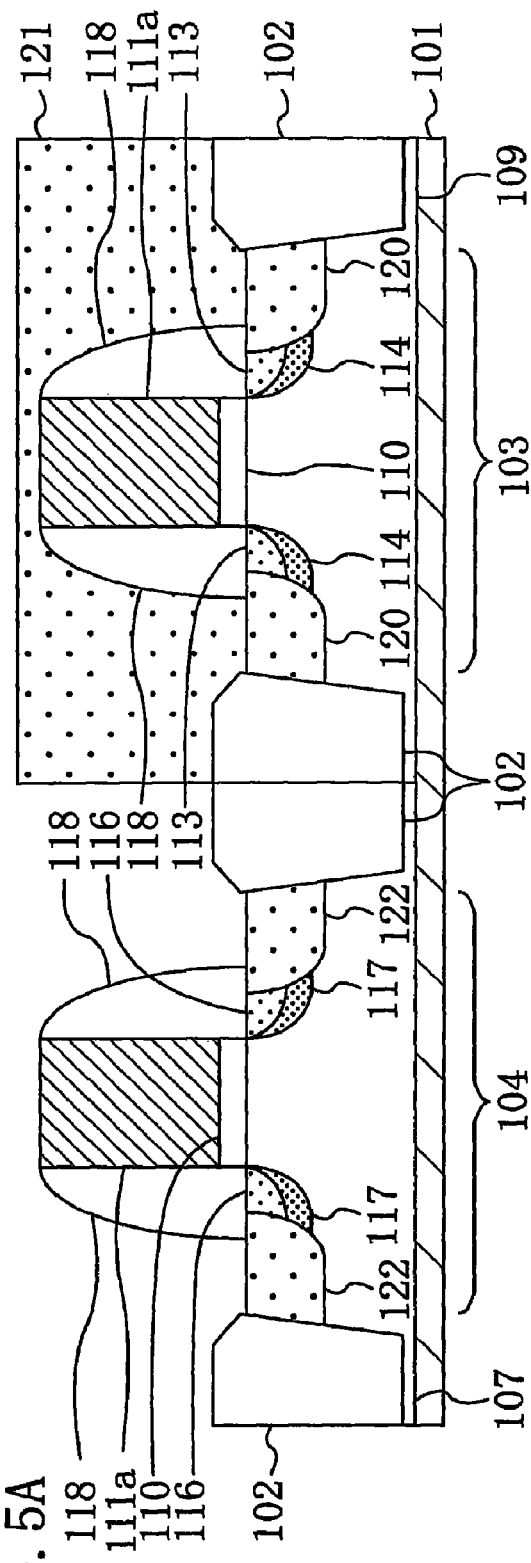
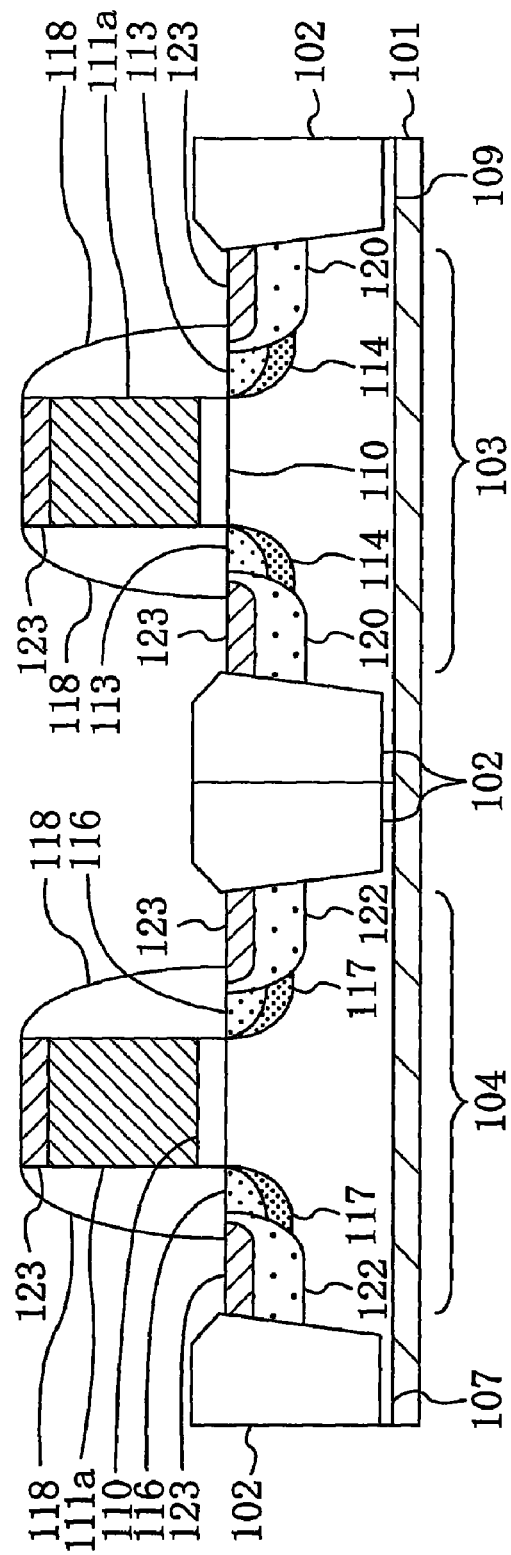

SEMICONDUCTOR DEVICE HAVING A FIELD EFFECT TRANSISTOR USING A HIGH DIELECTRIC CONSTANT GATE INSULATING FILM AND MANUFACTURING METHOD OF THE SAME

RELATED APPLICATIONS

This application is a divisional of U.S. application Ser. No. 11/254,727, filed Oct. 21, 2005, now U.S. Pat. No. 7,554,156, claiming priority of Japanese Application No. 2004-362971, filed Dec. 15, 2004, the entire contents of each of which are hereby incorporated by reference.

CROSS REFERENCE TO RELATED APPLICATIONS

This application claims priority under 35 U.S.C. §119 on Patent Application No. 2004-362971 filed in Japan on Dec. 15, 2004, the entire contents of which are hereby incorporated by reference.

BACKGROUND OF THE INVENTION

1. Field of the Invention

The present invention generally relates to a semiconductor device and a manufacturing method thereof. More particularly, the present invention relates to a semiconductor device that has a field effect transistor having a high dielectric constant gate insulating film, and a manufacturing method of such a semiconductor device.

2. Background Art

In order to realize higher integration, higher performance, and a higher operation speed of semiconductor integrated circuit devices, various technologies for improving transistor driving capability have been proposed. One of the technologies is a technology of increasing inversion-layer capacitance by reducing the thickness of a $SiO_2$ film and a SiON film (silicon oxynitride film) as a gate insulating film.

However, a thinner gate insulating film causes an increased tunneling current between a substrate and a gate electrode, resulting in increased power consumption.

In view of this problem, a technology has been proposed in which, instead of a $SiO_2$ film and a SiON film, a high dielectric constant film that is mainly made from an oxide of a high dielectric constant material such as hafnium (Hf), zirconium (Zr), and aluminum (Al) is used as a gate insulating film.

Hereinafter, a technology disclosed in Japanese Laid-Open Patent Publication No. 2003-69011 will be described with reference to the figures. More specifically, a semiconductor device that has a field effect transistor (FET) using a high dielectric constant film as a gate insulating film and a manufacturing method of such a semiconductor device will be described.

FIG. 12 schematically shows a semiconductor device 10 disclosed in Japanese Laid-Open Patent Publication No. 2003-69011. The semiconductor device 10 includes a FET having a high dielectric constant gate insulating film.

A P-conductivity type monocrystalline silicon (Si) substrate 11 of (100) orientation is used in the semiconductor device 10. First, an element isolation insulating region 12 is formed to define an active region in the substrate 11. Implantation of P-conductivity type ions for adjusting the substrate concentration, ion implantation for adjusting the threshold voltage, and heat treatment for activation are then conducted according to known technologies.

Thereafter, a high dielectric constant gate insulating film is formed. First, an $Al_2O_3$ film is formed by an ALCVD (Atomic Layer Chemical Vapor Deposition) method using trimethylaluminum ($Al(CH_3)_3$) and $H_2O$ as a row material gas and an oxidizing gas, respectively. A $SiO_2$ film of 0.5 nm thick is then formed by an ALCVD method using $Si_2H_6$ and $H_2O$. A composite film 13 of the $Al_2O_3$ film and the $SiO_2$ film is thus formed.

A $SiO_2$ film 14 of 0.6 nm thick is then formed between the $Al_2O_3$ film of the composite film 13 and the substrate 11 by an RTO (Rapid Thermal Oxidation) process in $O_2$.

An in-situ phosphorus-doped polycrystalline Si film of 100 nm thick is then formed on the substrate 11. The phosphorus-doped polycrystalline Si film is heat treated at 750° C. for five minutes in a nitrogen atmosphere, and then, patterned into a gate electrode 15 by a known technology such as etching.

By using the gate electrode 15 as a mask, arsenic (As) ions are perpendicularly implanted into the substrate 11 on both sides of the gate electrode 15. As a result, an extension region 16, a shallow diffusion layer, is formed. For example, the acceleration energy is 3 keV and the dose is $1\times10^{15}/cm^2$ in this ion implantation.

The extension region 16 has a lower As ion concentration than that of source and drain regions that are to be formed later. The extension region 16 is formed to reduce the electric field in the channel direction in the transistor.

By using the gate electrode 15 as a mask, boron (B) ions are perpendicularly implanted into a region under the extension region 16 in order to form a pocket region 17. The pocket region 17 is a P-conductivity type diffusion layer for preventing punch-through. For example, the acceleration energy is 10 keV and the dose is $4\times10^{15}/cm^2$ in this ion implantation.

A silicon oxide film of 50 nm thick is then deposited at a low temperature (400° C.) so as to cover the substrate 11 and the gate electrode 15. The silicon oxide film is then selectively etched by anisotropic dry etching so that the silicon oxide film is left only on the sidewall of the gate electrode 15. A sidewall 18 is thus formed.

By using the gate electrode 15 and the sidewall 18 as a mask, As ions are implanted into the substrate 11 on both sides of the sidewall 18 in order to form a source region and a drain region (hereinafter, referred to as source/drain regions 19). The source/drain regions 19 are N-type high concentration diffusion layers. In this ion implantation, the acceleration energy is 30 keV and the dose is $2\times10^{15}/cm^2$.

Nitrogen annealing is then conducted at 1,000° C. for five seconds in order to activate the implanted ions.

A thin cobalt (Co) film is then deposited by a sputtering method so as to cover the substrate 11, the gate electrode 15, and the like. Thereafter, annealing is conducted at 500° C. for a short period of time in order to silicide the Co film on the portions where silicon is exposed, that is, on the gate electrode 15 and the source/drain regions 19. The unreacted Co film on the element isolation insulating region 12, the sidewall 18 and the like is removed with a mixture of hydrochloric acid and a hydrogen peroxide solution. A Co silicide film 20 is thus formed. Heat treatment is then conducted for a short period of time in order to reduce the resistance of the Co silicide film 20.

A thick silicon oxide film is then deposited, and the surface of the silicon oxide film is planarized by chemical mechanical polishing. A surface protection insulating film 21 is thus formed. An opening is formed in a prescribed region of the surface protection insulating film 21. A titanium nitride (TiN) film and a tungsten (W) film are then deposited as a wiring barrier material and a wiring metal, respectively. Planarization is then conducted so that the W film remains only in the opening region. Thereafter, according to a required circuit structure, a metal film that is mainly made from aluminum is deposited and patterned to form wirings 22 for the gate, source, and drain.

In this way, an N-channel FET using a high dielectric constant film as a gate insulating film is formed.

SUMMARY OF THE INVENTION

However, it has been increasingly known that N-channel FETs having a high dielectric constant gate insulating film sometimes have poor threshold voltage controllability. The inventors also confirmed this fact through their study.

It has also been increasingly known that P-channel FETs having a high dielectric constant gate insulating film sometimes have poor threshold voltage controllability. The inventors also confirmed this fact through their study.

It is an object of the invention to improve threshold voltage controllability in a semiconductor device having N-channel and P-channel FETs having a high dielectric constant gate insulating film and a manufacturing method of the semiconductor device.

The inventors studied the reason why FETs having a high dielectric constant gate insulating film have reduced threshold voltage controllability, and obtained the following novel knowledge:

First, N-channel FETs will be described.

In order to form an extension region in an N-channel FET, arsenic (As) is commonly implanted into a substrate as N-type impurities. In an N-channel FET using a high dielectric constant gate insulating film, a remarkable reverse short-channel effect occurs when the As dose exceeds a prescribed value. As a result, threshold voltage controllability is reduced.

Such a remarkable reverse short-channel effect does not occur when a $SiO_2$ film, a SiN film or the like is used as a gate insulating film. In other words, such a remarkable reverse short-channel effect occurs specifically when a high dielectric constant gate insulating film is used. Moreover, such a remarkable reverse short-channel effect occurs when As is used as one of N-type impurities, and does not occur when other N-type impurities such as phosphorus (P) are used.

Moreover, such a remarkable reverse short-channel effect occurs when the As dose exceeds a prescribed value (that is, such a remarkable reverse short-channel effect does not occur when the As dose is equal to or smaller than the prescribed value). In other words, the As dose has a critical point regarding generation of the remarkable reverse short-channel effect. This critical point depends on the thickness of the high dielectric constant gate insulating film.

The inventors obtained the above knowledge about N-channel FETs.

Note that, the reverse short-channel effect is a phenomenon that the threshold voltage changes significantly depending on the gate length. More specifically, the reverse short-channel effect is a phenomenon that the threshold voltage increases sharply with a decrease in the gate length and decreases sharply when the gate length becomes shorter than a prescribed value.

In general, the reverse short-channel effect in N-channel FETs is considered to be caused by P-type impurities that have been introduced into a pocket region formed under the extension region. Since P-type impurities (positive charges) are present in the pocket region, the channel threshold value increases. As a result, a larger voltage is required to turn ON/OFF a transistor.

On the other hand, the reverse short-channel effect that was found by the inventors is caused by arsenic (As) as N-type impurities for forming the extension region.

Hereinafter, P-channel FETs will be described.

In order to form a pocket region in a P-channel FET, arsenic (As) is commonly implanted into a substrate as N-type impurities. In a P-channel FET using a high dielectric constant gate insulating film, an abnormally remarkable short-channel effect occurs when the As dose exceeds a prescribed value. As a result, threshold voltage controllability is reduced.

Such an abnormal short-channel effect does not occur when a $SiO_2$ film, a SiN film or the like is used as a gate insulating film. In other words, such an abnormal short-channel effect occurs specifically when a high dielectric constant gate insulating film is used. Moreover, such an abnormal short-channel effect occurs when As is used as one of N-type impurities, and does not occur when other N-type impurities such as phosphorus (P) are used.

Moreover, such an abnormal short-channel effect occurs when the As dose exceeds a prescribed value (that is, such an abnormal short-channel effect does not occur when the As dose is equal to or smaller than the prescribed value). In other words, the As dose has a critical point regarding generation of the abnormal short-channel effect. This critical point depends on the thickness of the high dielectric constant gate insulating film.

The inventors obtained the above knowledge about P-channel FETs.

Note that, the short-channel effect is a phenomenon that the threshold voltage changes depending on the gate length. More specifically, the short-channel effect is a phenomenon that the threshold voltage decreases sharply with a decrease in the gate length.

In order to achieve the above object based on the above novel knowledge, in a method for manufacturing a semiconductor device having an N-channel field effect transistor according to a first aspect of the invention, the N-channel field effect transistor is formed by a process including the steps of forming a high dielectric constant gate insulating film on a substrate, forming a gate electrode on the high dielectric constant gate insulating film, forming an extension region by introducing N-type impurities into the substrate by using at least the gate electrode as a mask, and forming a pocket region by introducing P-type impurities under the extension region in the substrate by using at least the gate electrode as a mask. An amount of arsenic (As) that is introduced as the N-type impurities is in a range that is equal to or lower than a prescribed value that is determined based on a thickness of the high dielectric constant gate insulating film.

According, to the manufacturing method of the first aspect of the invention, the amount of As that is introduced to form the extension region is smaller than a critical point that varies depending on the thickness of the high dielectric constant gate insulating film.

As described before, the inventors found that a reverse short-channel effect becomes more remarkable as the amount of As for forming the extension region is increased. Therefore, limiting the amount of As to a prescribed range suppresses generation of the reverse short-channel effect, and therefore, improves threshold voltage controllability.

It is considered that the reverse short-channel effect becomes more remarkable with an increase in the amount of As because As bonds with elements in the high dielectric constant gate insulating film and negative fixed charges are generated as a result. Therefore, the critical point of the amount of As depends on the thickness of the high dielectric constant gate insulating film.

Preferably, the range that is equal to or lower than the prescribed value is shown by the following expression:

$$Y_1 \leq -2.5 \times 10^{14} \cdot X_1 + 1.5 \times 10^{15}$$

where $X_1$ indicates the thickness (nm) of the high dielectric constant gate insulating film, and $Y_1$ indicates the amount of As (/cm$^2$).

By using this range of As to form the extension region, generation of the remarkable short-channel effect can be reliably suppressed and threshold voltage controllability can be reliably improved.

Preferably, the N-type impurities that are introduced to form the extension region include phosphorus (P).

Including phosphorus (P) in the N-type impurities not only allows the amount of As to be limited to the above range but allows a required amount of N-type impurities to be introduced into the substrate to form the extension region.

When the transistor structure allows selection of atoms other than As as the N-type impurities, the amount of As is preferably zero.

Since As causes a remarkable reverse short-channel effect, forming the extension region without using As as the N-type impurities reliably suppresses the reverse short-channel effect and improves threshold voltage controllability.

Preferably, the high dielectric constant gate insulating film contains at least one of an oxide of hafnium and an oxide of zirconium.

Hafnium and zirconium always generate negative fixed charges in the gate insulating film as a result of bonding with As. Therefore, in the method for manufacturing a semiconductor device having an N-channel field effect transistor having such a high dielectric constant gate insulating film, limiting the amount of As reliably improves threshold voltage controllability.

Preferably, the high dielectric constant gate insulating film further contains at least one of nitrogen and silicon.

The effects of the manufacturing method of a semiconductor device according to the invention can be reliably implemented even when such a high dielectric constant gate insulating film is used. In addition, when the high dielectric constant gate insulating film contains nitrogen and/or silicon, crystallization of the high dielectric constant gate insulating film is prevented. As a result, thermal stability can be improved and unnecessary leakage paths can be reduced.

In order to achieve the above object, in a semiconductor device having an N-channel field effect transistor according to a second aspect of the invention, the N-channel field effect transistor includes a substrate, a high dielectric constant gate insulating film, a gate electrode, an extension region, and a pocket region. The high dielectric constant gate insulating film is formed on the substrate. The gate electrode is formed on the high dielectric constant gate insulating film. The extension region is formed on both sides of the gate electrode in the substrate and contains at least one of arsenic (As) and phosphorus (P) as N-type impurities. The pocket region is formed under the extension region in the substrate and contains P-type impurities. Provided that $X_1$ indicates a thickness (nm) of the high dielectric constant gate insulating film and $Y_1$ indicates an amount of As (/cm$^2$) that is contained in the extension region as the N-type impurities, $Y_1$ is in the following range with respect to $X_1$:

$$Y_1 \leq -2.5 \times 10^{14} \cdot X_1 + 1.5 \times 10^{15}.$$

In the semiconductor device of the second aspect of the invention, the amount of As that is introduced as the N-type impurities to form the extension region is smaller than a critical point that varies depending on the thickness of the high dielectric constant gate insulating film.

As described before, a reverse short-channel effect becomes more remarkable as the amount of As for forming the extension region is increased. Therefore, limiting the amount of As can improve threshold voltage controllability.

Moreover, using phosphorous (P) as required in addition to arsenic (As) as the N-type impurities not only allows the amount of As to be limited to the above range but allows a required amount of N-type impurities to be contained in the extension region.

The semiconductor device according to the second aspect of the invention is therefore a semiconductor device having an N-channel field effect transistor with excellent threshold voltage controllability.

In order to achieve the above object, in a semiconductor device having an N-channel field effect transistor according to a third aspect of the invention, the N-channel field effect transistor includes a substrate, a high dielectric constant gate insulating film, a gate electrode, an extension region, and a pocket region. The high dielectric constant gate insulating film is formed on the substrate. The gate electrode is formed on the high dielectric constant gate insulating film. The extension region is formed on both sides of the gate electrode in the substrate and contains arsenic (As) and phosphorus (P) as N-type impurities. The pocket region is formed under the extension region in the substrate and contains P-type impurities. The extension region contains a larger amount of P than that of As.

In the semiconductor device of the third aspect of the invention, the extension region contains a larger amount of P than that of As as N-type impurities. This enables a required amount of N-type impurities to be contained in the extension region as well as suppresses the amount of As that is contained in the extension region. As a result, generation of a remarkable reverse short-channel effect can be suppressed and threshold voltage controllability of the N-channel field effect transistor can be improved.

The semiconductor device according to the third aspect of the invention is therefore a semiconductor device having an N-channel field effect transistor with excellent threshold voltage controllability.

Preferably, the high dielectric constant gate insulating film contains at least one of an oxide of hafnium and an oxide of zirconium.

Hafnium and zirconium always generate negative fixed charges in the gate insulating film as a result of bonding with As. Therefore, by limiting the amount of As, threshold voltage controllability is reliably improved in an N-channel field effect transistor having such a high dielectric constant gate insulating film.

In this way, a semiconductor device having an N-channel field effect transistor with reliably improved threshold voltage controllability is implemented.

Preferably, the high dielectric constant gate insulating film further contains at least one of nitrogen and silicon.

The effects of the invention can be reliably implemented even when such a high dielectric constant gate insulating film is used in an N-channel field effect transistor of a semiconductor device. In addition, when the high dielectric constant gate insulating film contains nitrogen and/or silicon, crystallization of the high dielectric constant gate insulating film is prevented. As a result, thermal stability can be improved and unnecessary leakage paths can be reduced.

In order to achieve the above object, in a method for manufacturing a semiconductor device having a P-channel field effect transistor according to a fourth aspect of the invention, the P-channel field effect transistor is formed by a process including the steps of forming a high dielectric constant gate insulating film on a substrate, forming a gate electrode on the high dielectric constant gate insulating film, forming an extension region by introducing P-type impurities into the substrate by using at least the gate electrode as a mask, and forming a pocket region by introducing N-type impurities under the extension region in the substrate by using at least the gate electrode as a mask. An amount of arsenic (As) that is introduced as the N-type impurities is in a range that is equal to or lower than a prescribed value that is determined based on a thickness of the high dielectric constant gate insulating film.

According to the manufacturing method of the fourth aspect of the invention, the amount of As that is introduced as the N-type impurities to form the pocket region is smaller than a critical point that varies depending on the thickness of the high dielectric constant gate insulating film.

As described before, the inventors found that a short-channel effect becomes abnormally remarkable as the amount of As for forming the pocket region is increased. Therefore, limiting the amount of As to a prescribed range suppresses generation of the abnormal short-channel effect in the P-channel field effect transistor, and therefore, improves threshold voltage controllability.

It is considered that the short-channel effect becomes abnormally remarkable with an increase in the amount of As because As bonds with elements in the high dielectric constant gate insulating film and negative fixed charges are generated as a result. Therefore, the critical point of the amount of As depends on the thickness of the high dielectric constant gate insulating film.

Preferably, the range that is equal to or lower than the prescribed value is shown by the following expression:

$$Y_2 \leq -1.5 \times 10^{13} \cdot X_2 + 9.0 \times 10^{13}$$

where $X_2$ indicates the thickness (nm) of the high dielectric gate insulating film, and $Y_2$ indicates the amount of As (/cm$^2$).

By introducing this range of As to form the pocket region, generation of the abnormal short-channel effect can be reliably suppressed and threshold voltage controllability can be reliably improved.

Preferably, the N-type impurities that are introduced to form the pocket region include phosphorus (P).

Including phosphorus (P) in the N-type impurities not only allows the amount of As to be limited to the above range but allows a required amount of N-type impurities to be introduced into the substrate to form the pocket region.

When the transistor structure allows selection of atoms other than As as the N-type impurities, the amount of As is preferably zero.

Since As causes an abnormal short-channel effect, forming the pocket region without using As as the N-type impurities reliably suppresses the abnormal short-channel effect and improves threshold voltage controllability.

Preferably, the high dielectric constant gate insulating film contains at least one of an oxide of hafnium and an oxide of zirconium.

Hafnium and zirconium always generate negative fixed charges in the gate insulating film as a result of bonding with As. Therefore, in the method for manufacturing a semiconductor device having a P-channel field effect transistor having such a high dielectric constant gate insulating film, limiting the amount of As reliably improves threshold voltage controllability.

Preferably, the high dielectric constant gate insulating film further contains at least one of nitrogen and silicon.

The effects of the manufacturing method of a semiconductor device according to the invention can be reliably implemented even when such a high dielectric constant gate insulating film is used. In addition, when the high dielectric constant gate insulating film contains nitrogen and/or silicon, crystallization of the high dielectric constant gate insulating film is prevented. As a result, thermal stability can be improved and unnecessary leakage paths can be reduced.

In order to achieve the above object, in a semiconductor device having a P-channel field effect transistor according to a fifth aspect of the invention, the P-channel field effect transistor includes a substrate, a high dielectric constant gate insulating film, a gate electrode, an extension region, and a pocket region. The high dielectric constant gate insulating film is formed on the substrate. The gate electrode is formed on the high dielectric constant gate insulating film. The extension region is formed on both sides of the gate electrode in the substrate and contains P-type impurities. The pocket region is formed under the extension region in the substrate and contains at least one of arsenic (As) and phosphorus (P) as N-type impurities. Provided that $X_2$ indicates a thickness (nm) of the high dielectric constant gate insulating film and $Y_2$ indicates an amount of As (/cm$^2$) that is contained in the pocket region as the N-type impurities, $Y_2$ is in the following range with respect to $X_2$:

$$Y_2 \leq -1.5 \times 10^{13} \cdot X_2 + 9.0 \times 10^{13}.$$

In the semiconductor device of the fifth aspect of the invention, the amount of As that is introduced as the N-type impurities to form the pocket region is smaller than a critical point that varies depending on the thickness of the high dielectric constant gate insulating film.

As described before, a short-channel effect becomes abnormally remarkable as the amount of As for forming the pocket region is increased. Therefore, limiting the amount of As can improve threshold voltage controllability.

Moreover, using phosphorous (P) as required in addition to arsenic (As) as the N-type impurities not only allows the amount of As to be limited to the above range but allows a required amount of N-type impurities to be contained in the pocket region.

The semiconductor device according to the fifth aspect of the invention is therefore a semiconductor device having a P-channel field effect transistor with excellent threshold voltage controllability.

In order to achieve the above object, in a semiconductor device having a P-channel field effect transistor according to a sixth aspect of the invention, the P-channel field effect transistor includes a substrate, a high dielectric constant gate insulating film, a gate electrode, an extension region, and a pocket region. The high dielectric constant gate insulating film is formed on the substrate. The gate electrode is formed on the high dielectric constant gate insulating film. The extension region is formed on both sides of the gate electrode in the substrate and contains P-type impurities. The pocket region is formed under the extension region in the substrate and contains arsenic (As) and phosphorus (P) as N-type impurities. The pocket region contains a larger amount of P than that of As.

In the semiconductor device of the sixth aspect of the invention, the pocket region contains a larger amount of P than that of As as N-type impurities. This enables a required amount of N-type impurities to be contained in the pocket region as well as suppresses the amount of As that is contained in the pocket region. As a result, generation of an abnormal short-channel effect can be suppressed and threshold voltage controllability can be improved.

The semiconductor device according to the sixth aspect of the invention is therefore a semiconductor device having a P-channel field effect transistor with excellent threshold voltage controllability.

Preferably, the high dielectric constant gate insulating film contains at least one of an oxide of hafnium and an oxide of zirconium.

Hafnium and zirconium always generate negative fixed charges in the gate insulating film as a result of bonding with As. Therefore, by limiting the amount of As, threshold voltage controllability is reliably improved in a P-channel field effect transistor having such a high dielectric constant gate insulating film.

In this way, a semiconductor device having a P-channel field effect transistor with reliably improved threshold voltage controllability is implemented.

Preferably, the high dielectric constant gate insulating film further contains at least one of nitrogen and silicon.

The effects of the P-channel field effect transistor of the invention can be reliably implemented even when such a high dielectric constant gate insulating film is used. In addition, when the high dielectric constant gate insulating film contains nitrogen and/or silicon, crystallization of the high dielectric constant gate insulating film is prevented. As a result, thermal stability can be improved and unnecessary leakage paths can be reduced.

As has been described above, in a semiconductor device having an N-channel field effect transistor and a manufacturing method thereof according to the invention, adjusting the amount of As that is introduced to form an extension region suppresses a reverse short-channel effect and improves threshold voltage controllability.

Moreover, in a semiconductor device having a P-channel field effect transistor and a manufacturing method thereof according to the invention, adjusting the amount of As that is introduced to form a pocket region suppresses an abnormal short-channel effect and improves threshold voltage controllability.

BRIEF DESCRIPTION OF THE DRAWINGS

FIGS. 2A and 2B illustrate a method for manufacturing a semiconductor device having a FET according to the first and second embodiments of the invention and show the steps up to formation of a polysilicon layer for forming a gate electrode;

FIGS. 3A and 3B illustrate a method for manufacturing a semiconductor device having a FET according to the first and second embodiments of the invention and show the steps up to formation of a P-type pocket region;

FIGS. 4A and 4B illustrate a method for manufacturing a semiconductor device having a FET according to the first and second embodiments of the invention and show the steps up to formation of N-type source and drain regions;

FIGS. 5A and 5B illustrate a method for manufacturing a semiconductor device having a FET according to the first and second embodiments of the invention and show steps up to formation of a silicide layer;

DETAILED DESCRIPTION OF THE INVENTION

First Embodiment

Hereinafter, a first embodiment of the present invention will be described with reference to the accompanying drawings.

FIGS. 1A, 1B, FIGS. 2A, 2B, FIGS. 3A, 3B, FIGS. 4A, 4B and FIGS. 5A, 5B illustrate a method for manufacturing a semiconductor device having a field effect transistor (FET) according to the present embodiment, and show a manufacturing process of a semiconductor device having a CMOS-FET (Complementary Metal Oxide Semiconductor Field Effect Transistor).

Figure 1A:
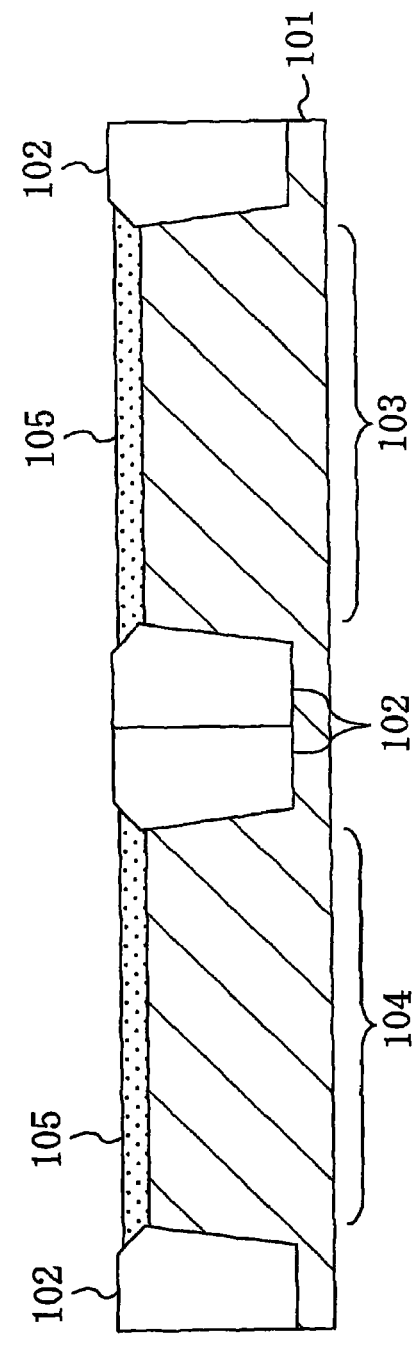
FIGS. 1A and 1B illustrate a method for manufacturing a semiconductor device having a FET (Field Effect Transistor) according to first and second embodiments of the invention and show the steps up to formation of a channel region with N-type impurities introduced therein.

As shown in FIG. 1A, an element isolation region 102 is formed in a P-type silicon substrate 101 by STI (Shallow Trench Isolation). The P-type silicon substrate 101 of (100) orientation is herein used as an example of the substrate. The element isolation region 102 defines an NMOS (n-channel Metal Oxide Semiconductor) formation region 103 and a PMOS (p-channel Metal Oxide Semiconductor) formation region 104 in the P-type silicon substrate 101.

An oxide film 105 is formed on the P-type silicon substrate 101 as a protection film.

Figure 1B:
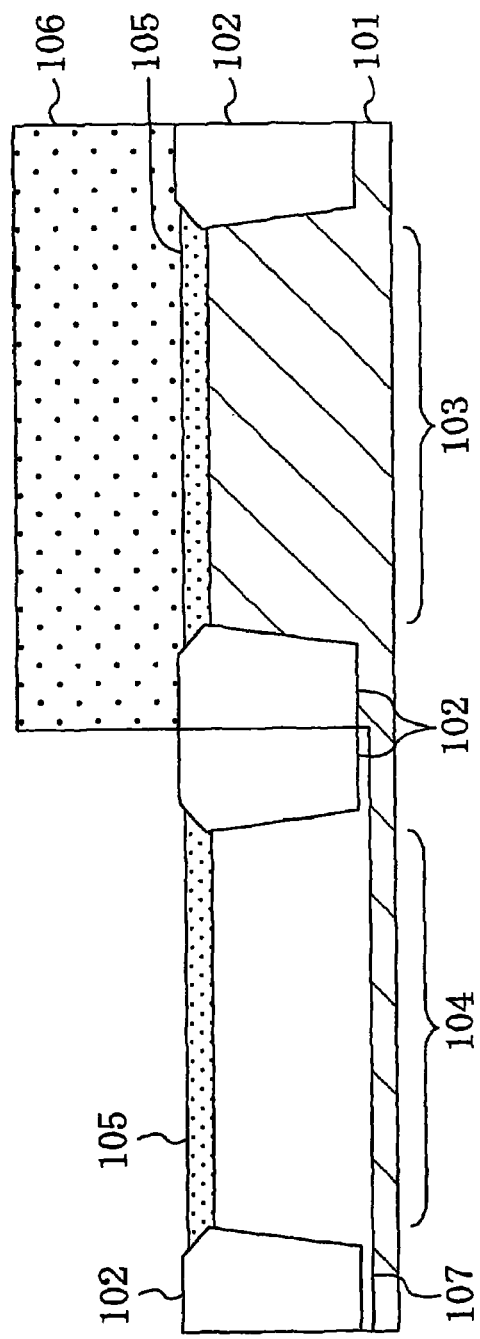

As shown in FIG. 1B, a mask 106 that covers the NMOS formation region 103 is formed. The mask 106 is formed by forming a photoresist film on the substrate and then patterning the photoresist film.

Thereafter, an N-well 107 is formed in the PMOS formation region 104 that is not covered by the mask 106. The N-well 107 is formed by implanting phosphorus (P) ions into the PMOS formation region 104 of the P-type silicon substrate 101 as N-type impurities.

By implanting arsenic (As) ions into the N-well 107, a channel region (not shown) having N-type impurities introduced therein is formed at the surface of the N-well 107.

As shown in FIG. 2A, the mask 106 is removed, and a mask 108 that covers the PMOS formation region 104 is formed. The mask 108 is formed by forming a photoresist film on the substrate and patterning the photoresist film.

A P-well 109 is then formed in the NMOS formation region 103 that is not covered by the mask 108. The P-well 109 is formed by implanting boron (B) ions into the NMOS formation region 103 of the P-type silicon substrate 101 as P-type impurities.

By further implanting B ions into the P-well 109, a channel region (not shown) having P-type impurities introduced therein is formed at the surface of the P-well 109. For example, the implantation energy is 30 keV and the dose is $1.0 \times 10^{13}/cm^2$ in this ion implantation.

As shown in FIG. 2B, the mask 108 is then removed and the oxide film 105 is etched back.

A gate insulating film 110 is then formed on the P-type silicon substrate 101. The gate insulating film 110 is formed as a lamination film as described below.

First, a $SiO_2$ film having a thickness of about 0.8 nm to about 1.3 nm is formed on the P-type silicon substrate 101 as a gate oxide film. Hafnium (Hf) is deposited on the $SiO_2$ film by a sputtering method using argon (Ar) gas. The Hf film thus deposited is then subjected to a RTO process in $N_2$ gas containing diluted $O_2$. As a result, an $HfO_2$ film, a high dielectric constant film, is formed on the $SiO_2$ film. If necessary, the $HfO_2$ film thus formed is subjected to post-deposition annealing in oxygen or nitrogen.

The lamination of the $SiO_2$ film and the $HfO_2$ film thus formed functions as a gate insulating film 110. In the present embodiment, the gate insulating film 110 is 2.9 nm thick. However, the thickness of the gate insulating film 110 is not specifically limited.

A SiON film or a silicon nitride film may be formed instead of the $SiO_2$ film.

A silicon nitride film or the like may be deposited on the gate insulating film 110 as a cap layer for improving heat resistance and for preventing diffusion of Hf into a gate electrode (a gate electrode 111a that will be formed later).

A polysilicon layer 111 is then formed on the gate insulating film 110 (in the case where the cap layer is formed, the polysilicon layer 111 is formed on the cap layer).

As shown in FIG. 3A, by patterning the polysilicon layer 111, a gate electrode 111a is formed in each of the NMOS formation region 103 and the PMOS formation region 104.

If necessary, an offset spacer may be formed on the sidewall of the gate electrode 111a by forming a $SiO_2$ film that covers the substrate 101, the gate electrodes 111a, and the like and etching the $SiO_2$ film. The offset spacer is formed as required in order to adjust a relative position of an extension region, a pocket region, and the like (which will be formed later) to the electrode 111a.

As shown in FIG. 3B, a mask 112 that covers the PMOS formation region 104 is formed. The mask 112 is formed by forming a photoresist film on the substrate and patterning the photoresist film.

In the NMOS formation region 103 that is not covered by the mask 112, As ions are implanted into the P-well 109 as N-type impurities. This ion implantation is conducted by using the gate electrode 111a as a mask. As a result, an N-type extension region 113 is formed at the surface of the P-well 109 on both sides of the gate electrode 111a. Conditions for this ion implantation will be described later.

A P-type pocket region 114 is then formed under the N-type extension region 113 by implanting B ions. This ion implantation is conducted by quad implantation in which each implantation is conducted at implantation energy of 10 keV and a dose of $8\times10^{12}/cm^2$. This ion implantation is also conducted by using the gate electrode 111a as a mask.

Quad implantation is an ion implantation method that is conducted when ions are implanted into the substrate obliquely rather than perpendicularly with respect to the substrate in order to form a pocket region and the like. In quad implantation, ion implantation is conducted four times with the substrate rotated by 90 degrees for each implantation.

As shown in FIG. 4A, the mask 112 is then removed, and a mask 115 that covers the NMOS formation region 103 is formed. The mask 115 is formed by forming a photoresist film on the substrate and then patterning the photoresist film.

In the PMOS formation region 104 that is not covered by the mask 115, B ions are implanted into the N-well 107 as P-type impurities. This ion implantation is conducted by quad implantation in which each implantation is conducted at implantation energy of 0.5 keV and a dose of $8\times10^{13}/cm^2$. In this ion implantation, the gate electrode 111a is used as a mask. As a result, a P-type extension region 116 is formed at the surface of the N-well 107 on both sides of the gate electrode 111a.

An N-type pocket region 117 is then formed under the P-type extension region 116 by implanting As ions. This ion implantation is also conducted by using the gate electrode 111a as a mask. Conditions for this ion implantation will be described later.

As shown in FIG. 4B, the mask 115 is then removed, and a sidewall 118 is formed on the sidewall of the gate electrode 111a. The sidewall 118 is formed by forming an insulating film (such as SiN) so as to cover the P-type silicon substrate 101, the gate electrode 111a and the like, and then patterning the insulating film by anisotropic etching or the like.

A mask 119 that covers the PMOS formation region 104 is then formed. The mask 119 is formed by forming a photoresist film on the substrate and then patterning the photoresist film.

Thereafter, As ions and P ions are sequentially implanted into the P-well 109 by using the gate electrode 111a and the sidewall 118 as a mask.

For As ions, the implantation energy is 10 keV and the dose is $5\times10^{15}/cm^2$. For P ions, the implantation energy is 5 keV and the dose is $5\times10^{14}/cm^2$.

With this ion implantation and heat treatment that is conducted in a later step, an N-type source region and an N-type drain region (hereinafter, collectively referred to as N-type source/drain regions 120) are formed at the surface of the P-well 109 on both sides of the sidewall 118.

As shown in FIG. 5A, the mask 119 is then removed, and a mask 121 that covers the NMOS formation region 103 is formed. The mask 121 is formed by forming a photoresist film on the substrate and then patterning the photoresist film.

Thereafter, B ions are implanted into the N-well 107 by using the gate electrode 111a and the sidewall 118 as a mask. In this ion implantation, the implantation energy is 3 keV and the dose is $3\times10^{15}/cm^2$.

The mask 121 is then removed and heat treatment is conducted. As a result, a P-type source region and a P-type drain region (hereinafter, collectively referred to as P-type source/drain regions 122) are formed at the surface of the N-well 107 on both sides of the sidewall 118. The N-type source/drain regions 120 described above are formed simultaneously with the P-type source/drain regions 122 by this heat treatment.

As shown in FIG. 5B, a silicide layer 123 (such as $CoSi_2$ or NiSi) is then formed on the N-type source/drain regions 120, the P-type source/drain regions 122, and the gate electrodes 111a.

An oxide film (not shown) or the like may have been formed on the respective surfaces of the N-type source/drain regions 120, the P-type source/drain regions 122, and the gate electrodes 111a by natural oxidation. In this case, this oxide film or the like is etched back before the silicide film 123 is formed.

Although not shown in the figures, an insulating layer, wirings and the like are formed thereafter.

A semiconductor device having a CMOSFET using a high dielectric constant gate insulating film according to this embodiment is produced by the above manufacturing method.

Of the CMOSFET, the N-channel FET that is formed in the NMOS formation region 103 will be specifically described in the present embodiment. Hereinafter, implantation of As ions for forming the N-type extension region 113 in FIG. 3B will be described.

Figure 6:
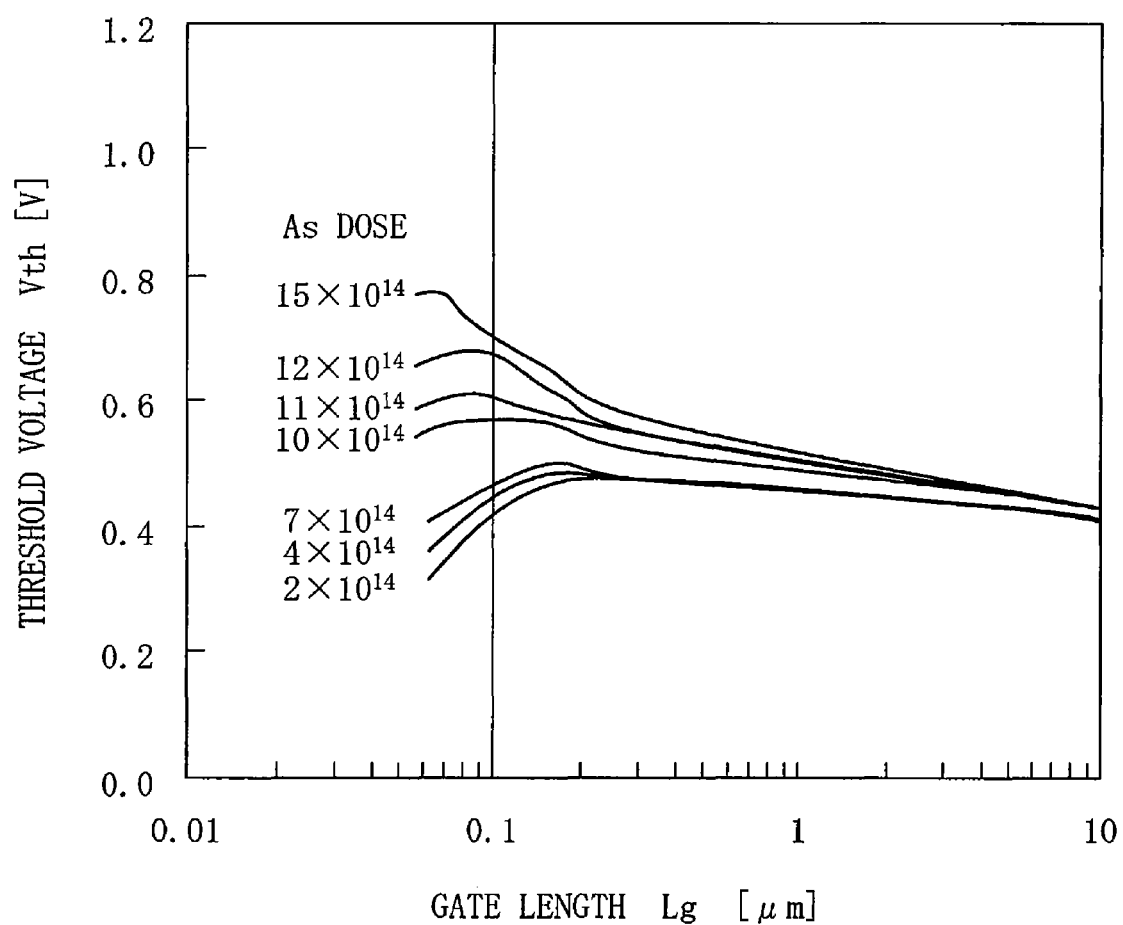
FIG. 6 shows the relation between the gate length and the threshold voltage of an N-channel FET for several As doses to an extension region.

FIG. 6 shows the relation between the gate length and the threshold voltage of the N-channel FET formed by implantation of As ions at implantation energy of 1 keV and several As doses. The As doses are $2\times10^{14}/cm^2$, $4\times10^{14}/cm^2$, $7\times10^{14}/cm^2$, $10\times10^{14}/cm^2$, $11\times10^{14}/cm^2$, $12\times10^{14}/cm^2$, and $15\times10^{14}/cm^2$.

As shown in FIG. 6, at every As dose, the threshold voltage gradually increases as the gate length decreases from about 10 μm. However, a reverse short-channel effect occurs at a certain As dose or higher. In other words, at a certain As dose and higher, the threshold voltage increases sharply as the gate length becomes closer to 0.1 μm. A remarkable reverse short-channel effect occurs especially at the As dose of $10\times10^{14}/cm^2$ or higher.

As the gate length becomes further shorter, the threshold voltage decreases at every As dose due to a normal short-channel effect.

When such a remarkable reverse short-channel effect occurs, a slight change in the gate length significantly changes the threshold voltage. Therefore, it is difficult to control the threshold voltage, a parameter for determining ON/OFF characteristics of transistors, and therefore, it is difficult to produce an N-channel FET having a prescribed threshold voltage. Such a remarkable reverse short-channel effect is therefore a serious cause to reduce the product yield of semiconductor devices.

As can be seen from FIG. 6, the threshold voltage changes in an ideal manner at the As dose of $2\times10^{14}/cm^2$ to $7\times10^{14}/cm^2$. In other words, the threshold voltage changes gradually as the gate length decreases from about 10 μm. But this change in the threshold voltage is very slight and the threshold voltage has an approximately constant value at the gate length from about 10 μm to a value close to 0.1 μm. As the gate length becomes further shorter, the threshold voltage gradually decreases at a prescribed gate length or less due to a normal short-channel effect of N-channel FETs.

On the other hand, a remarkable reverse short-channel effect occurs at the As dose of $10\times10^{14}/cm^2$ or higher, as described above.

Figure 7:
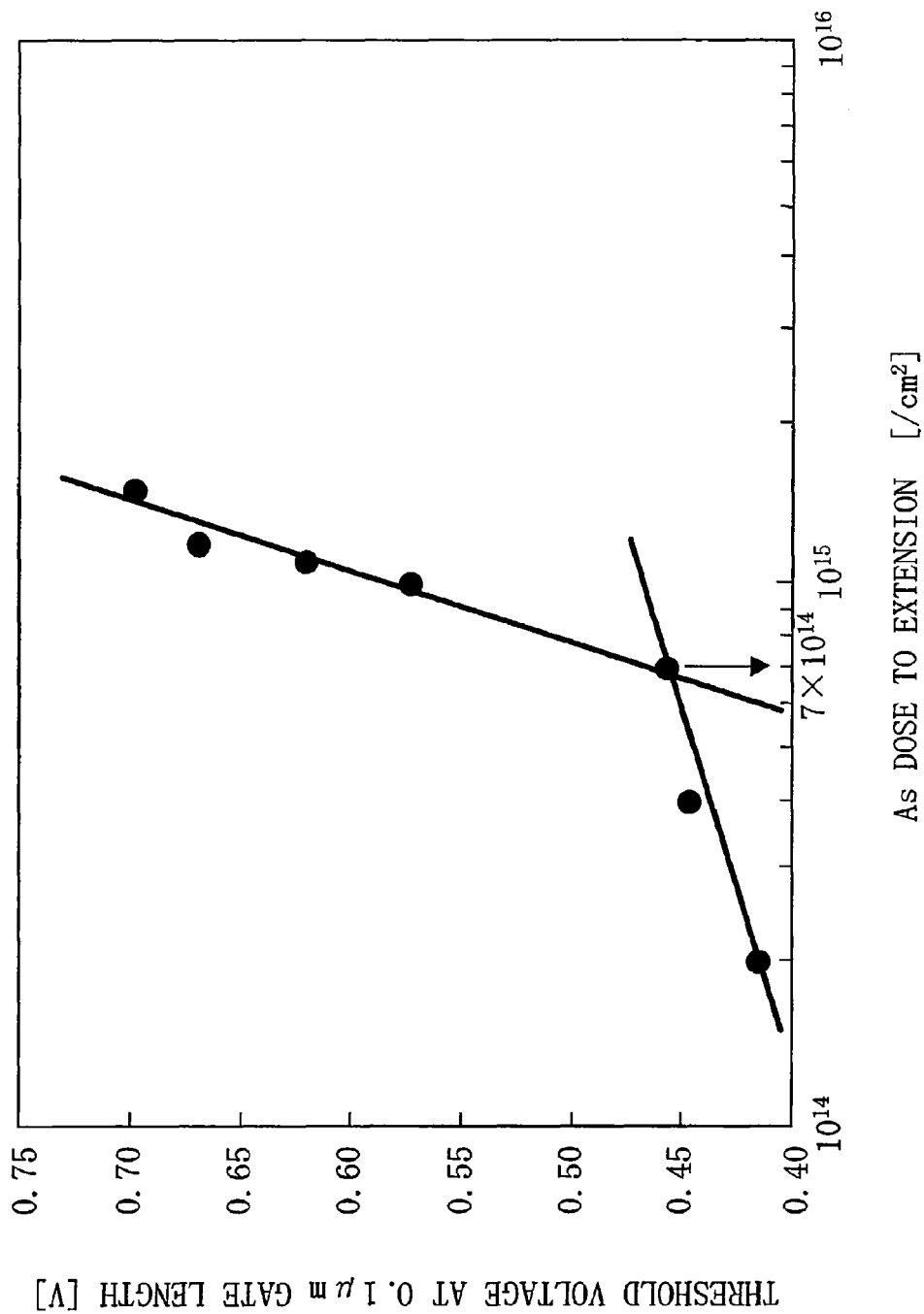
FIG. 7 shows the relation between the threshold voltage and the As dose to the extension region.

FIG. 7 shows the relation between the threshold voltage at the gate length of 0.1 μm and the As dose to the extension region. In other words, FIG. 7 shows a threshold voltage for each As dose at the gate length of 0.1 μm in FIG. 6.

As shown in FIG. 7, the threshold voltage does not vary significantly and has an approximately constant value when the As dose to the extension region is $7\times10^{14}/cm^2$ or less. However, the threshold voltage increases sharply when the As dose exceeds $7\times10^{14}/cm^2$.

It is considered from the above result that the As dose for forming the extension region has a critical point of whether a remarkable reverse short-channel effect occurs or not. Therefore, limiting the As dose for forming the N-type extension region 113 to a prescribed range suppresses such a remarkable reverse short-channel effect and thus improves threshold voltage controllability.

The inventors found that it was when a high dielectric constant gate insulating film (such as a film that was mainly made from Hf) was used as a gate insulating film that such a reverse short-channel effect occurred depending on the As dose, and found that the reverse short-channel effect did not occur depending on the As dose when a commonly used $SiO_2$ or SiON film was used as a gate insulating film.

It is considered from the above that the reason why the reverse short-channel effect occurs when the As dose for forming an extension region in N-channel FETs having a high dielectric constant gate insulating film (such as a Hf-containing film) is equal to or higher than a critical point is as follows:

When the As dose is equal to or higher than a certain value, As diffuses into the gate insulating film and bond with Hf atoms in the gate insulating film. Moreover, when As is implanted (especially when As is obliquely implanted), As may be directly implanted into the high dielectric constant gate insulating film and may bond with Hf atoms in the gate insulating film. As a result, negative fixed charges are generated in the gate insulating film, increasing the threshold voltage for controlling ON/OFF state of the N-channel MOSFET.

Especially the edge portion of the gate insulating film contains many negative fixed charges. This is because the edge portion of the gate insulating film is close to the N-type extension region 113 and because As may be directly implanted into the end portion of the gate insulating film. When the gate length is sufficiently long, the negative fixed charges that are present mainly at the edge of the gate insulating film have only a slight influence. However, the influence of the negative fixed charges at the edge of the gate insulating film increases as the gate length becomes shorter.

In the method for manufacturing a semiconductor device having a FET according to the present embodiment, the gate insulating film 110 that is formed in the step of FIG. 2B has a thickness of 2.9 nm. In this case, the critical point of the As dose regarding whether a remarkable reverse short-channel effect occurs or not is $7\times10^{14}/cm^2$, as described above. Therefore, when the gate insulating film 110 has a thickness of 2.9 nm, forming the N-type extension region 113 at the As dose of $7\times10^{14}/cm^2$ or less suppresses the reverse short-channel effect. As a result, excellent threshold voltage controllability can be realized.

Figure 8:
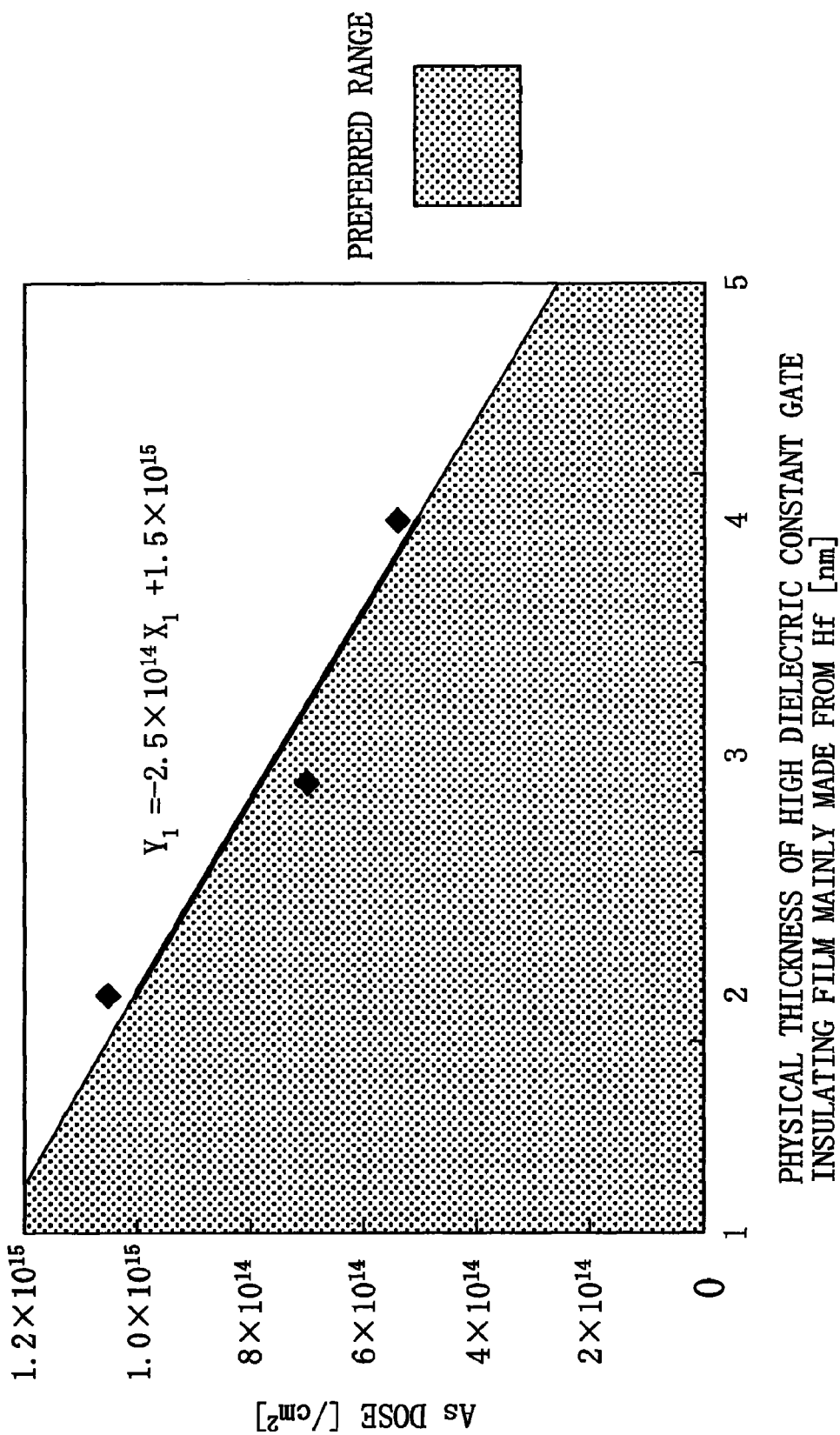
FIG. 8 shows a preferred range of the As dose according to the thickness of a gate insulating film.

FIG. 8 shows a preferred As dose range according to the thickness of the gate insulating film 110. In FIG. 8, $X_1$ indicates a physical thickness (nm) of the gate insulating film 110 (a high dielectric constant gate insulating film that is mainly made from Hf), and $Y_1$ indicates an As dose ($/cm^2$) to the N-type extension region 113.

The critical point of $Y_1$ (the upper limit of the As dose) which does not cause a remarkable reverse short-channel effect depends on $X_1$, and can be represented by a straight line shown by the following expression (1):

$$Y_1 = -2.5\times10^{14} \cdot X_1 + 1.5\times10^{15} \qquad (1).$$

$Y_1$ is preferably in the range below this straight line. In other words, $Y_1$ is preferably in the range shown by the following expression (2) with respect to $X_1$:

$$Y_1 \leq -2.5\times10^{14} \cdot X_1 + 1.5\times10^{15} \qquad (2).$$

Using $Y_1$ of this range can suppress generation of a remarkable reverse short-channel effect, and therefore, can improve threshold voltage controllability. As a result, excellent threshold voltage controllability can be implemented in the method for manufacturing a semiconductor device having an N-channel FET using a high dielectric constant gate insulating film.

It is assumed that $Y_1$ indicates the amount of As that is contained in the N-type extension region 113. In this case, an N-channel FET having excellent threshold voltage controllability and a semiconductor device having such an N-channel FET can be realized when $Y_1$ is in the range of the expression (2).

In the present embodiment, the gate insulating film 110 is formed as follows: a $SiO_2$ film is formed on the P-type silicon substrate 101 and an $HfO_2$ film is formed on the $SiO_2$ film, and the resultant lamination of the $SiO_2$ film and the $HfO_2$ film is subjected to post-deposition annealing. Therefore, the physical thickness $X_1$ of the gate insulating film 110 is a physical thickness of the whole film that serves as a gate insulating film, that is, a physical thickness of the film ranging from a high Si-content oxide film close to the P-type silicon substrate 101 to a high Hf-content film close to the gate electrode 111a.

The critical point of the As dose $Y_1$ decreases as $X_1$ increases. The reason for this is considered as follows: as the thickness of the gate insulating film 110 increases, the amount of elements (such as Hf) which bond with As increases, and a larger amount of negative fixed charges are produced by the reaction between As and the elements.

When the As dose $Y_1$ is in the range of the expression (2), the amount of N-type impurities for forming the N-type extension region 113 may become insufficient. In this case, a required amount of phosphorus (P) is implanted as N-type impurities in addition to the As dose in the range of the expression (2). The amount of phosphorus (P) may be larger than the As dose. In other words, N-type impurities for forming the N-type extension region 113 may mainly contain phosphorus (P). Without using As, only phosphorus (P) may be implanted as N-type impurities in order to form the N-type extension region 113.

The reverse short-channel effect that is to be solved in the present embodiment is caused by As. In this regard, a smaller As dose is better. The actual As dose and the actual P dose are determined based on other factors such as diffusion property of As and P in the substrate.

Implantation of As and/or P for forming the N-type extension region 113 may be conducted after a part of the substrate is made amorphous by implantation of Si or Ge.

Second Embodiment

Hereinafter, a semiconductor device having an FET and a manufacturing method thereof according to a second embodiment of the invention will be described with reference to the accompanying drawings.

The steps of the manufacturing method of a semiconductor device having an FET according to the present embodiment are the same as those of the manufacturing method of a semiconductor device having a CMOSFET which is described in the first embodiment with reference to the drawings. Therefore, only a characteristic part of the present embodiment will be described in detail, and description of other steps will be omitted by reference to the first embodiment.

Of the CMOSFET, the P-channel FET that is formed in the PMOS formation region 104 will be specifically described in the present embodiment. Hereinafter, implantation of As ions for forming the N-type pocket region 117 in FIG. 4A will be described.

Figure 9:
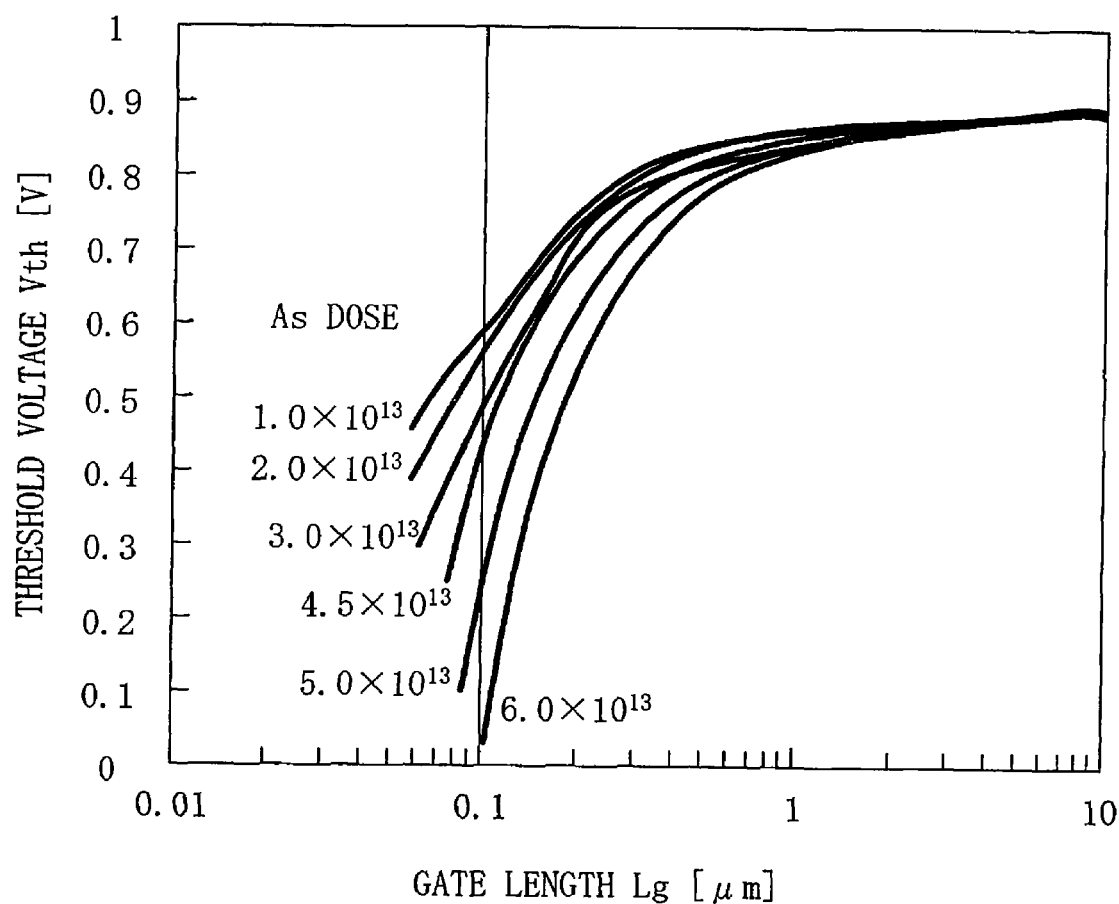
FIG. 9 shows the relation between the gate length and the threshold voltage of a P-channel FET for several As doses to a pocket region.

FIG. 9 shows the relation between the gate length and the threshold voltage of the P-channel FET formed by implantation of As ions at implantation energy of 40 keV and several As doses. The As doses are $1\times10^{13}/cm^2$, $2\times10^{13}/cm^2$, $3\times10^{13}/cm^2$, $4.5\times10^{13}/cm^2$, $5\times10^{13}/cm^2$, and $6\times10^{13}/cm^2$.

For P-channel FETs, a negative voltage is applied as a gate voltage. In FIG. 9, the threshold voltage is shown as an absolute value. Therefore, a smaller absolute value is herein described as a lower threshold voltage, and a larger absolute value is herein described as a higher threshold voltage.

As shown in FIG. 9, at every As dose, the threshold voltage gradually decreases as the gate length decreases from about 10 μm. However, a short-channel effect (a sharp decrease in the threshold voltage) occurs as the gate length becomes closer to the range of 0.1 μm to 0.2 μm.

A more abnormally remarkable short-channel effect than normally expected occurs at the As dose of $4.5\times10^{13}/cm^2$ or higher.

When such an abnormal short-channel effect occurs, a slight change in the gate length significantly changes the threshold voltage. Therefore, it is difficult to control the threshold voltage, a parameter for determining ON/OFF characteristics of transistors, and therefore, it is difficult to produce a P-channel FET having a prescribed threshold voltage. Such an abnormal short-channel effect is therefore a serious cause to reduce the product yield of semiconductor devices.

It is desirable that the threshold voltage gradually change as the gate length decreases from about 10 μm but that this change in the threshold voltage be very slight and the threshold voltage have an approximately constant value at the gate length from about 10 μm to about 0.1 μm to about 0.2 μm. It is also desirable that, as the gate length becomes further shorter, the threshold voltage gradually decrease at a prescribed gate length or less due to a normal short-channel effect of P-channel FETs.

Figure 10:
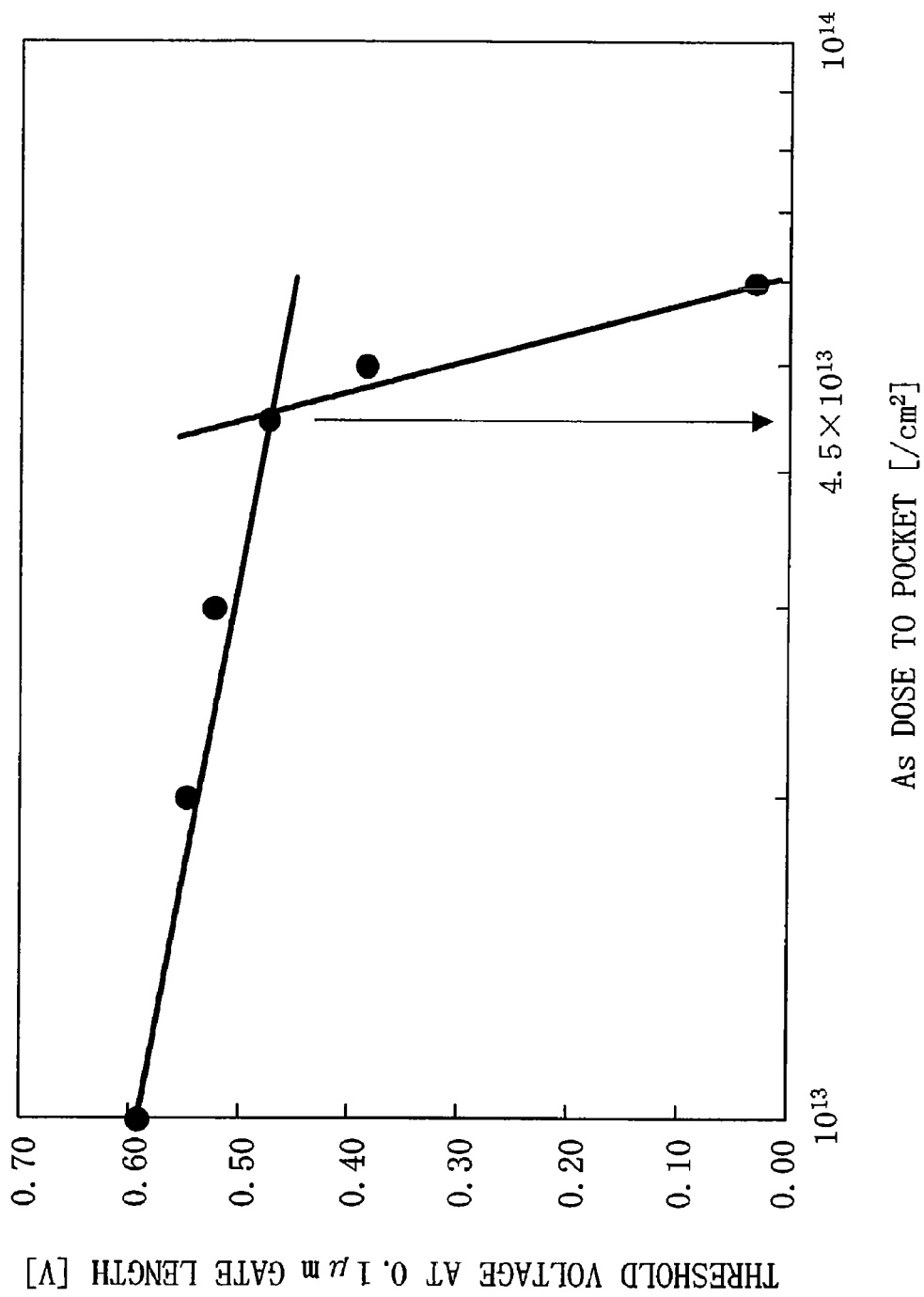
FIG. 10 shows the relation between the threshold voltage and the As dose to the pocket region.

FIG. 10 shows the relation between the threshold voltage at the gate length of 0.1 μm and the As dose to the pocket region. In other words, FIG. 10 shows a threshold voltage at each As dose at the gate length of 0.1 μm in FIG. 9.

As shown in FIG. 10, the threshold voltage does not vary significantly and has an approximately constant value when the As dose to the pocket region is $4.5\times10^{13}/cm^2$ or less. However, the threshold voltage decreases sharply when the As dose exceeds $4.5\times10^{13}/cm^2$.

It is considered from the above result that the As dose for forming the pocket region has a critical point of whether an abnormal short-channel effect occurs or not. Therefore, limiting the As dose for forming the N-type pocket region 117 to a prescribed range suppresses such an abnormal short-channel effect and thus improves threshold voltage controllability.

The inventors found that it was when a high dielectric constant gate insulating film (such as a film that was mainly made from Hf) was used as a gate insulating film that such an abnormal short-channel effect occurred depending on the As dose, and found that the abnormal short-channel effect did not occur depending on the As dose when a commonly used $SiO_2$ or SiON film was used as a gate insulating film.

It is considered from the above that the reason why the abnormal short-channel effect occurs when the As dose for forming a pocket region in P-channel FETs having a high dielectric constant gate insulating film (such as a Hf-containing film) is equal to or higher than a critical point is as follows:

When the As dose is equal to or higher than a certain value, As diffuses into the gate insulating film and bond with Hf atoms in the gate insulating film. Moreover, when As is implanted (especially when As is obliquely implanted), As may be directly implanted into the high dielectric constant gate insulating film and may bond with Hf atoms in the gate insulating film. As a result, negative fixed charges are generated in the gate insulating film, reducing the threshold voltage for controlling ON/OFF state of the P-channel MOSFET.

Especially the edge portion of the gate insulating film contains many negative fixed charges. This is because the edge portion of the gate insulating film is close to the N-type pocket region 117 and because As may be directly implanted into the edge portion of the gate insulating film. When the gate length is sufficiently long, the negative fixed charges that are present mainly at the edge of the gate insulating film have only a slight influence. However, the influence of the negative fixed charges at the edge of the gate insulating film increases as the gate length becomes shorter.

In the method for manufacturing a semiconductor device having a FET according to the present embodiment, the gate insulating film 110 that is formed in the step of FIG. 2B has a thickness of 2.9 nm. In this case, the critical point of the As dose regarding whether an abnormally remarkable short-channel effect occurs or not is $4.5\times10^{13}/cm^2$, as described above. Therefore, when the gate insulating film 110 has a thickness of 2.9 nm, forming the N-type pocket region 117 at the As dose of $4.5\times10^{13}/cm^2$ or less suppresses the abnormal short-channel effect. As a result, excellent threshold voltage controllability can be realized.

Figure 11:
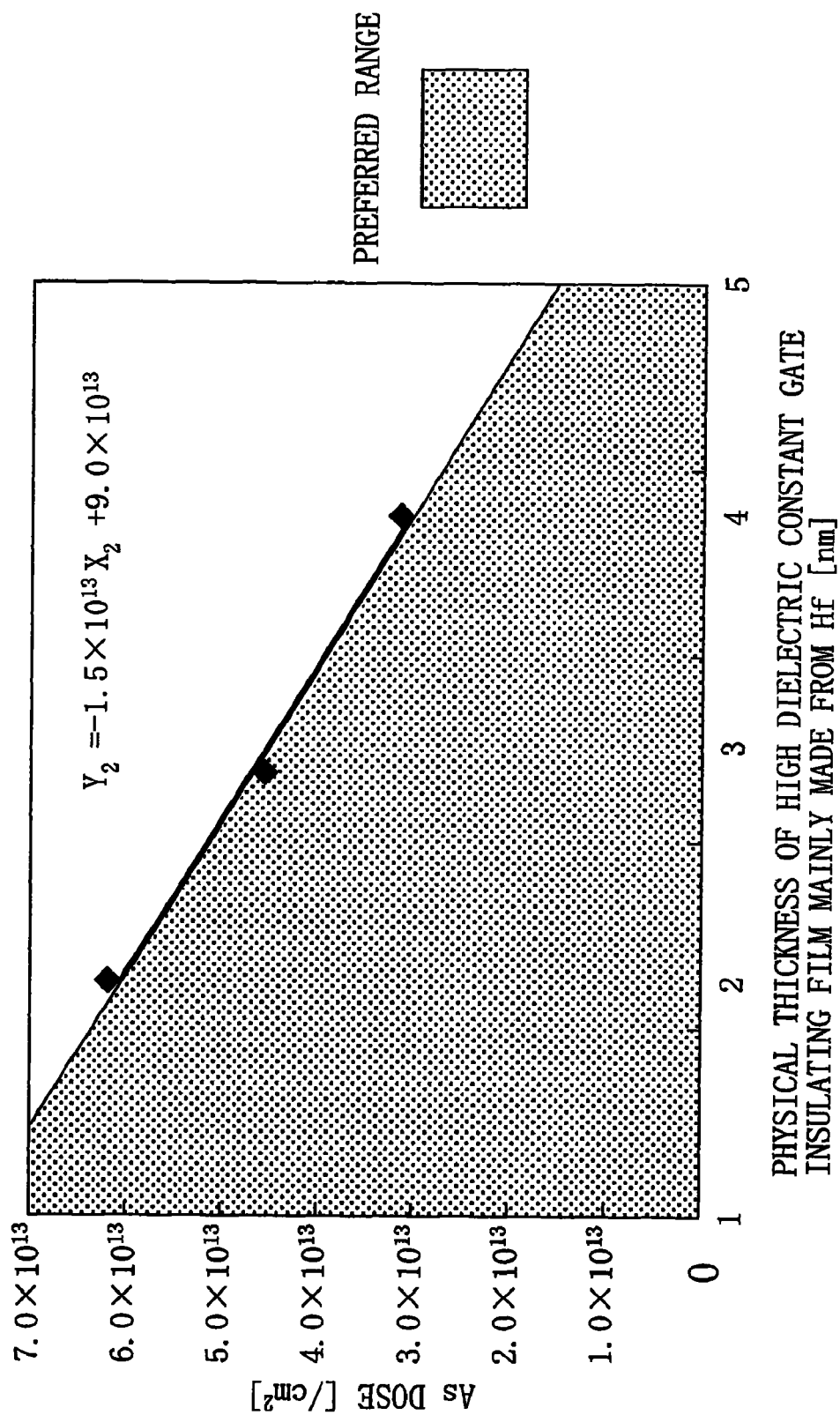
FIG. 11 shows a preferred range of the As dose according to the thickness of a gate insulating film.
Figure 12:
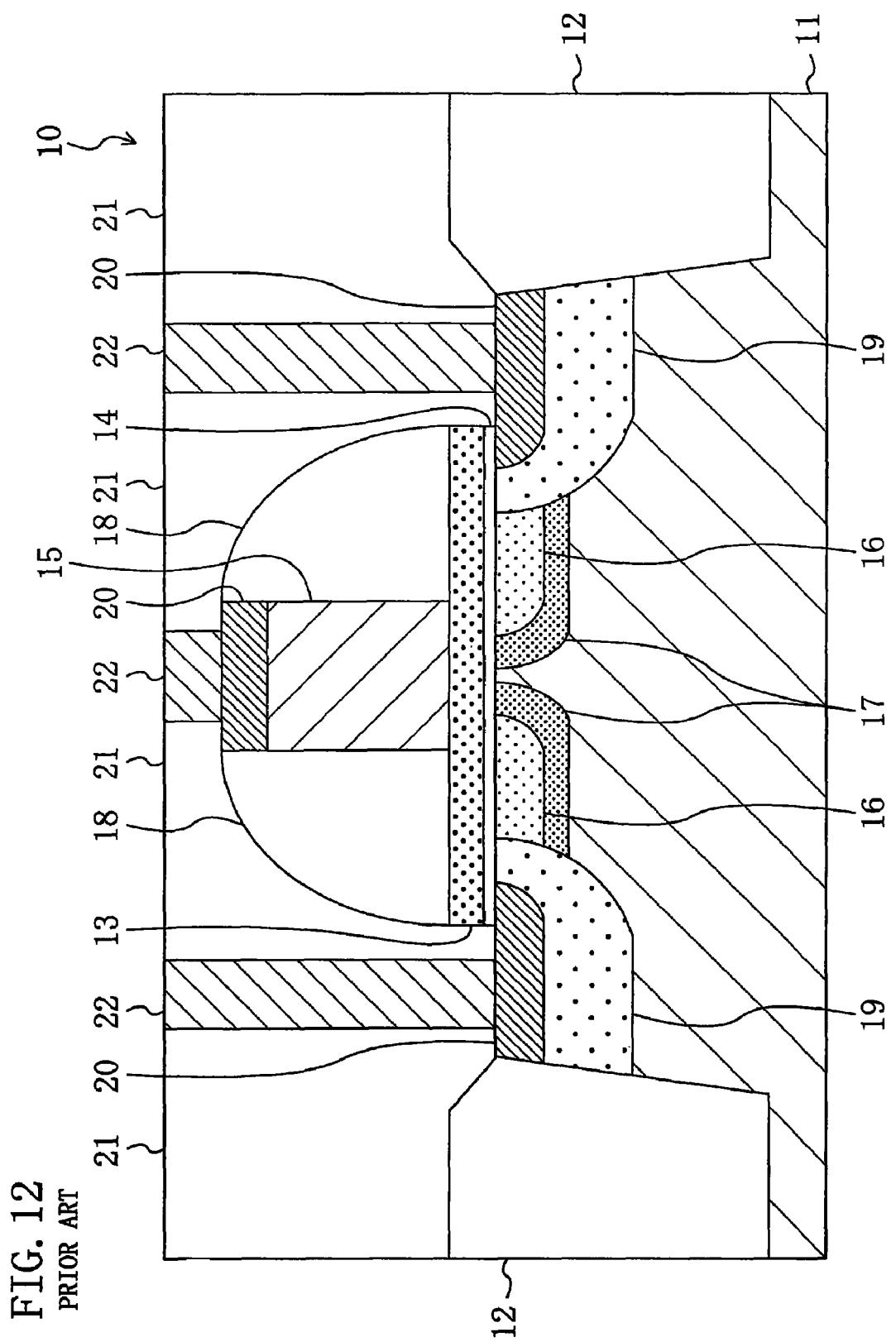
FIG. 12 illustrates a conventional semiconductor device having a MOSFET (Metal Oxide Semiconductor Field Effect Transistor) using a high dielectric gate insulating film, and a conventional manufacturing method thereof.

FIG. 11 shows a preferred As dose range according to the thickness of the gate insulating film 110. In FIG. 11, $X_2$ indicates a physical thickness (nm) of the gate insulating film 110 (a high dielectric constant gate insulating film that is mainly made from Hf), and $Y_2$ indicates an As dose ($/cm^2$) to the N-type pocket region 117.

The critical point of $Y_2$ (the upper limit of the As dose) which does not cause an abnormal short-channel effect depends on $X_2$, and can be represented by a straight line shown by the following expression (3):

$$Y_2 = -1.5\times10^{13}\cdot X_2 + 9.0\times10^{13} \tag{3}$$

$Y_2$ is preferably in the range below this straight line. In other words, $Y_2$ is preferably in the range shown by the following expression (4) with respect to $X_2$:

$$Y_2 \leq -1.5\times10^{13}\cdot X_2 + 9.0\times10^{13} \tag{4}$$

Using $Y_2$ of this range can suppress generation of an abnormal short-channel effect, and therefore, can improve threshold voltage controllability. As a result, excellent threshold voltage controllability can be implemented in the method for manufacturing a semiconductor device having a P-channel FET using a high dielectric constant gate insulating film.

It is assumed that $X_2$ indicates the amount of As that is contained in the N-type pocket region 117. In this case, a P-channel FET having excellent threshold voltage controllability and a semiconductor device having such a P-channel FET can be realized when $Y_2$ is in the range of the expression (4).

As described with respect to $X_1$ in the first embodiment, the physical thickness $X_2$ of the gate insulating film 110 is a physical thickness of the whole film that serves as a gate insulating film.

The critical point of the As dose $Y_2$ decreases as $X_2$ increases. The reason for this is considered as follows: as the thickness of the gate insulating film 110 increases, the amount of elements (such as Hf) which bond with As increases, and a larger amount of negative fixed charges are produced by the reaction between As and the elements.

When the As dose $Y_2$ is in the range of the expression (4), the amount of N-type impurities for forming the N-type pocket region 117 may become insufficient. In this case, a required amount of phosphorus (P) is implanted as N-type impurities in addition to the As dose in the range of the expression (4). The amount of phosphorus (P) may be larger than the As dose. In other words, N-type impurities for forming the N-type pocket region 117 may mainly contain phosphorus (P). Without using As, only phosphorus (P) may be implanted as N-type impurities in order to form the N-type pocket region 117.

The abnormal short-channel effect that is to be solved in the present embodiment is caused by As. In this regard, a smaller As dose is better. The actual As dose and the actual P dose are determined based on other factors such as diffusion property of As and P in the substrate.

Expressions such as the expressions (1) and (3), that is, expressions showing dependence of a critical value regarding the As dose on the thickness of the high dielectric constant gate insulating film, may have different coefficients depending on the gate length of the FET, the type of the gate insulating film, and the like. However, expressions corresponding to the expressions (1) and (3) can be obtained by the same method as that described in the first and second embodiments. As a result, the range of As dose for realizing excellent threshold voltage controllability can be obtained.

The conditions for impurity implantation (such as implantation energy and a dose) shown in the specification are by way of example only, and the invention is not limited to the values shown herein.

In the first and second embodiments, an $HfO_2$-containing film is used as a high dielectric constant gate insulating film. However, the high dielectric constant gate insulating film is not limited to this film. For example, the effects of the invention can be obtained even when a $ZrO_2$-containing film is used as a high dielectric constant gate insulating film.

The $HfO_2$ film or the $ZrO_2$ film may further contain an element that forms an oxide, such as silicon (Si), aluminum (Al), tantalum (Ta), titanium (Ti) or lanthanum (La). Alternatively, BST ($(Ba, Sr)TiO_3$) or the like may be used. A ternary oxide film (such as $Hf_xAl_yO_z$) may be used.

The above oxide films may further contain silicon. In other words, a silicate film may be used. Alternatively, the above oxide films may further contain nitrogen. By using such a film, crystallization of the high dielectric constant gate insulating film is prevented. As a result, heat resistance can be improved and unnecessary leakage paths can be reduced.

In the first and second embodiments, the $HfO_2$ film is formed by a PVD (Physical Vapor Deposition) method. However, the invention is not limited to this. For example, a CVD (Chemical Vapor Deposition) method may be used. In this case, the following materials can be used: as a liquid Hf source, t-butoxide ($C_{16}H_{36}HfO_4$), TDEAH (tetrakis diethylamido hafnium, $C_{16}H_{40}N_4Hf$), TDMAH (tetrakis dimethylamino hafnium, $C_8H_{24}N_4Hf$), $Hf(MMP)_4$ (tetrakis 1-methoxy-2-methyl-2-propoxy hafnium and $Hf[OC(CH_3)_2CH_2OCH_3]_4$) and the like; and as a solid source, $Hf(NO_3)_4$ and the like.

Alternatively, an ALD (Atomic Layer Deposition) method may be used. In the ALD method, a substrate is alternately exposed to an Hf material (such as Hf metal, $HfCl_4$, Hf t-butoxide, Hf nitrate, or TDEA-Hf) and a substituting gas material (such as $O_2$, $H_2O$, NO, $N_2O$, or $NH_3$).

Instead of the CVD method, a plasma CVD method or a JVD (Jet Vapor Deposition) method may be used. Instead of $O_2$, NO, $N_2O$, $H_2O$, $O_3$ or the like may be used as an oxygen-containing gas.

In the first and second embodiments, the gate electrode 111a is formed from polysilicon. However, the invention is not limited to this. The gate electrode 111a may be a metal electrode. For example, after the surface of the high dielectric constant film is treated with nitrogen, an Al/TiN lamination electrode or a metal nitride (such as TiN or TaN) may be formed.

The gate electrode 111a may contain Si, Ge, or the like, or may contain at least one material selected from Ti, Si, Ge, Ta, TaN, $TaSi_xN_y$, Ru, $RuO_2$, RuO, WN, Mo, MoO, and MoN.

In the first and second embodiments, the P-type silicon substrate 101 is used as a substrate. However, an N-type silicon substrate may be used. Although the substrate of (100) orientation is used in the first and second embodiments, another orientation (110) or (111) may be used. A strained Si substrate containing Ge or the like may be used.

For example, the strained Si substrate is a substrate that is formed as a lamination of a Si substrate, a SiGe buffer layer, a SiGe layer, and a Si epitaxial layer. More specifically, a SiGe buffer layer having a thickness of about 0.5 μm and having a gradient composition in the depth direction is formed on a Si substrate, a SiGe layer having a thickness of about 1.5 nm is formed on the SiGe buffer layer, and a Si epitaxial layer having a thickness of about 10 nm is formed on the SiGe layer.

A SiGe substrate or a SOI (Silicon On Insulator) substrate may be used. Substrates to be used in the present invention are not specifically limited.

The method for manufacturing a semiconductor device having an FET according to the first and second embodiments enables semiconductor devices having an FET with excellent threshold voltage controllability to be manufactured with an improved yield.

What is claimed is:

1. A semiconductor device having an N-channel field effect transistor, wherein the N-channel field effect transistor includes:
    a substrate,
    a high dielectric constant gate insulating film formed on the substrate,
    a gate electrode formed on the high dielectric constant gate insulating film,
    an extension region formed on both sides of the gate electrode in the substrate and containing arsenic (As) and phosphorus (P) as N-type impurities, and
    a pocket region formed under the extension region in the substrate and containing P-type impurities, wherein
    the extension region contains a larger amount of P than that of As,
    the high dielectric constant gate insulating film has negative fixed charges at an edge portion, and
    As inducing the negative fixed charges is introduced in the gate insulating film.

2. The semiconductor device according to claim 1, wherein the high dielectric constant gate insulating film contains at least one of an oxide of hafnium and an oxide of zirconium.

3. The semiconductor device according to claim 2, where the high dielectric constant gate insulating film further contains at least one of nitrogen and silicon.

4. The semiconductor device according to claim 1, wherein the gate length of the gate electrode is 0.1 µm or less.

5. The semiconductor device according to claim 1, wherein an offset spacer is provided on a sidewall of the gate electrode.

6. The semiconductor device according to claim 1, wherein a cap layer is provided on the gate insulating film under the gate electrode.

7. The semiconductor device according to claim 1, wherein As in the high dielectric constant gate insulating film substantially bonds with atoms other than As contained in the high dielectric constant gate insulating film.

8. The semiconductor device according to claim 1, wherein As in the high dielectric constant gate insulating film substantially bonds with Hf atoms contained in the high dielectric constant gate insulating film.

9. The semiconductor device according to claim 1, wherein the high dielectric constant gate insulating film has a thickness of 2.9 nm or less.

10. The semiconductor device according to claim 1, wherein the extension region contains Ge.

* * * * *